(12) United States Patent
Kim et al.

(10) Patent No.: US 8,054,891 B2
(45) Date of Patent: Nov. 8, 2011

(54) CHANNEL EQUALIZER AND METHOD OF PROCESSING BROADCAST SIGNAL IN DTV RECEIVING SYSTEM

(75) Inventors: Byoung Gill Kim, Seoul (KR); In Hwan Choi, Gyeonggi-do (KR); Kyung Won Kang, Seoul (KR); Kook Yeon Kwak, Gyeonggi-do (KR); Woo Chan Kim, Gyeonngi-do (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 12/961,435

(22) Filed: Dec. 6, 2010

(65) Prior Publication Data

US 2011/0078535 A1    Mar. 31, 2011

Related U.S. Application Data

(63) Continuation of application No. 11/674,099, filed on Feb. 12, 2007, now Pat. No. 7,876,835.

(60) Provisional application No. 60/883,154, filed on Jan. 2, 2007.

(30) Foreign Application Priority Data

Feb. 10, 2006   (KR) .................. 10-2006-0013128
Sep. 15, 2006   (KR) .................. 10-2006-0089736

(51) Int. Cl.
*H04N 5/44* (2011.01)
*H04N 5/38* (2006.01)
*H04N 5/40* (2006.01)
*H04N 5/455* (2006.01)
*H04N 5/21* (2006.01)
*H04N 7/12* (2006.01)

(52) U.S. Cl. .................. 375/240.27; 375/229; 375/231; 375/232; 375/240.01; 375/240.02; 348/607; 348/608; 348/611; 348/612; 348/614; 348/723; 348/724; 348/725; 348/726; 348/728

(58) Field of Classification Search .................. 375/229, 375/231, 232, 240.25–240.27; 348/607–614, 348/723–726, 728
See application file for complete search history.

(56) References Cited

U.S. PATENT DOCUMENTS 4,642,755 A   2/1987   Hinch
(Continued)

FOREIGN PATENT DOCUMENTS

CA   2404404   3/2003
(Continued)

OTHER PUBLICATIONS

Chernock, Rich; "PSIP Generation and ATSC Stream Monitoring"; Triveni Digital, Oct. 8, 2004.

(Continued)

*Primary Examiner* — Chiem M Fan
*Assistant Examiner* — Eboni Hughes
(74) *Attorney, Agent, or Firm* — Lee, Hong, Degerman, Kang & Waimey

(57) ABSTRACT

A channel equalizer includes a first transformer, an estimator, an average calculator, a second transformer, a coefficient calculator, a compensator, and a third transformer. The first transformer converts normal data into frequency domain data, where a known data sequence is periodically repeated in the normal data. The estimator estimates channel impulse responses (CIR) during known data intervals adjacent to each normal data block. The average calculator calculates an average value of the CIRs. The second transformer converts the average value into frequency domain data. The coefficient calculator calculates equalization coefficients using the average value, and the compensator compensates channel distortion of each normal data block using the coefficients. The third transformer converts the compensated data block into time domain data.

8 Claims, 15 Drawing Sheets

U.S. PATENT DOCUMENTS

| | | |
|---|---|---|
| 5,177,796 A | 1/1993 | Feig et al. |
| 5,208,816 A | 5/1993 | Seshardi et al. |
| 5,258,987 A | 11/1993 | Wei |
| 5,301,167 A | 4/1994 | Proakis et al. |
| 5,488,635 A | 1/1996 | Chennakeshu et al. |
| 5,502,506 A | 3/1996 | Choi |
| 5,508,752 A | 4/1996 | Kim et al. |
| 5,511,096 A | 4/1996 | Huang et al. |
| 5,602,593 A | 2/1997 | Katto |
| 5,606,569 A | 2/1997 | Macdonald et al. |
| 5,619,269 A | 4/1997 | Lee et al. |
| 5,636,251 A | 6/1997 | Citta et al. |
| 5,691,993 A | 11/1997 | Fredrickson |
| 5,754,651 A | 5/1998 | Blatter et al. |
| 5,757,416 A | 5/1998 | Birch et al. |
| 5,771,239 A | 6/1998 | Moroney et al. |
| 5,867,503 A | 2/1999 | Ohsuga et al. |
| 5,903,324 A | 5/1999 | Lyons et al. |
| 5,956,373 A | 9/1999 | Goldsten et al. |
| 5,978,424 A | 11/1999 | Turner |
| 6,005,894 A | 12/1999 | Kumar |
| 6,021,421 A | 2/2000 | Retter et al. |
| 6,049,651 A | 4/2000 | Oshima |
| 6,075,569 A | 6/2000 | Lee et al. |
| 6,124,898 A | 9/2000 | Patel et al. |
| 6,212,659 B1 | 4/2001 | Zehavi |
| 6,219,386 B1 | 4/2001 | Amrany et al. |
| 6,226,380 B1 | 5/2001 | Ding |
| 6,233,295 B1 | 5/2001 | Wang |
| 6,243,469 B1 | 6/2001 | Kataoka et al. |
| 6,272,660 B1 | 8/2001 | Chen et al. |
| 6,289,485 B1 | 9/2001 | Shiomoto |
| 6,334,187 B1 | 12/2001 | Kadono |
| 6,339,618 B1 | 1/2002 | Puri et al. |
| 6,356,598 B1 | 3/2002 | Wang |
| 6,405,338 B1 | 6/2002 | Sinha et al. |
| 6,411,253 B1 | 6/2002 | Cox et al. |
| 6,446,234 B1 | 9/2002 | Cox et al. |
| 6,456,611 B1 | 9/2002 | Hu et al. |
| 6,459,741 B1 | 10/2002 | Grabb et al. |
| 6,470,047 B1 | 10/2002 | Kleinerman et al. |
| 6,490,007 B1 | 12/2002 | Bouillet et al. |
| 6,498,936 B1 | 12/2002 | Raith |
| 6,512,759 B1 | 1/2003 | Hashimoto et al. |
| 6,515,713 B1 | 2/2003 | Nam |
| 6,553,538 B2 | 4/2003 | Zehavi |
| 6,573,947 B1 | 6/2003 | Oh |
| 6,577,685 B1 | 6/2003 | Bao et al. |
| 6,650,880 B1 | 11/2003 | Lee et al. |
| 6,651,250 B1 | 11/2003 | Takai |
| 6,665,308 B1 | 12/2003 | Rakib et al. |
| 6,665,343 B1 | 12/2003 | Jahanghir et al. |
| 6,671,002 B1 | 12/2003 | Konishi et al. |
| 6,686,880 B1 | 2/2004 | Marko et al. |
| 6,687,310 B1 | 2/2004 | Fimoff et al. |
| 6,694,518 B1 | 2/2004 | Dulac |
| 6,704,358 B1 | 3/2004 | Li et al. |
| 6,731,700 B1 | 5/2004 | Yaknich et al. |
| 6,734,920 B2 | 5/2004 | Ghosh et al. |
| 6,738,949 B2 | 5/2004 | Senda et al. |
| 6,744,474 B2 | 6/2004 | Markman |
| 6,744,822 B1 | 6/2004 | Gaddam et al. |
| 6,744,926 B1 | 6/2004 | Nishigaki |
| 6,760,077 B2 | 7/2004 | Choi et al. |
| 6,768,517 B2 | 7/2004 | Limberg et al. |
| 6,775,334 B1 | 8/2004 | Liu et al. |
| 6,803,970 B1 | 10/2004 | Limberg et al. |
| 6,810,084 B1 | 10/2004 | Jun et al. |
| 6,810,090 B1 | 10/2004 | Perlow |
| 6,816,204 B2 | 11/2004 | Limberg |
| 6,827,941 B1 | 12/2004 | Lüddecke et al. |
| 6,842,875 B2 | 1/2005 | Kondo et al. |
| 6,904,110 B2 | 6/2005 | Trans et al. |
| 6,909,743 B1 | 6/2005 | Ward et al. |
| 6,917,655 B2 | 7/2005 | Fimoff et al. |
| 6,922,215 B2 | 7/2005 | Choi et al. |
| 6,924,753 B2 | 8/2005 | Bretl et al. |
| 6,925,126 B2 | 8/2005 | Lan et al. |
| 6,927,708 B2 | 8/2005 | Fimoff |
| 6,934,331 B2 | 8/2005 | Kamikura et al. |
| 6,944,242 B2 | 9/2005 | Yaknich et al. |
| 6,947,487 B2 | 9/2005 | Choi et al. |
| 6,952,595 B2 | 10/2005 | Ikedo et al. |
| 6,956,619 B2 | 10/2005 | Choi et al. |
| 6,973,137 B2 | 12/2005 | Birru et al. |
| 6,975,689 B1 | 12/2005 | McDonald et al. |
| 6,977,914 B2 | 12/2005 | Paila et al. |
| 6,977,977 B1 | 12/2005 | Dubrovin et al. |
| 6,980,603 B2 | 12/2005 | Choi et al. |
| 6,984,110 B2 | 1/2006 | Jang |
| 6,985,420 B2 | 1/2006 | Shishido |
| 6,985,537 B1 | 1/2006 | Milbar |
| 6,993,021 B1 | 1/2006 | Chuah et al. |
| 6,993,062 B1 | 1/2006 | Kong et al. |
| 6,996,133 B2 | 2/2006 | Bretl et al. |
| 7,010,038 B2 | 3/2006 | Choi et al. |
| 7,016,446 B1 | 3/2006 | Spalink |
| 7,020,481 B2 | 3/2006 | Kivijarvi |
| 7,030,935 B2 | 4/2006 | Choi et al. |
| 7,038,732 B1 | 5/2006 | Limberg et al. |
| 7,042,949 B1 | 5/2006 | Omura et al. |
| 7,050,419 B2 | 5/2006 | Azenkot et al. |
| 7,079,584 B2 | 7/2006 | Feher |
| 7,085,324 B2 | 8/2006 | Choi et al. |
| 7,092,447 B2 | 8/2006 | Choi et al. |
| 7,092,455 B2 | 8/2006 | Choi et al. |
| 7,095,707 B2 | 8/2006 | Rakib et al. |
| 7,096,484 B2 | 8/2006 | Mao et al. |
| 7,102,692 B1 | 9/2006 | Carlsgaard et al. |
| 7,110,449 B2 | 9/2006 | Heo et al. |
| 7,111,221 B2 | 9/2006 | Birru et al. |
| 7,130,313 B2 | 10/2006 | Pekonen |
| 7,148,932 B2 | 12/2006 | Choi et al. |
| 7,151,575 B1 | 12/2006 | Landry et al. |
| 7,170,849 B1 | 1/2007 | Arivoli et al. |
| 7,194,047 B2 | 3/2007 | Strolle et al. |
| 7,209,459 B2 | 4/2007 | Kangas |
| 7,218,671 B2 | 5/2007 | Jeong et al. |
| 7,221,358 B2 | 5/2007 | Sasaki |
| 7,295,623 B2 | 11/2007 | Raghavan |
| 7,333,153 B2 | 2/2008 | Hartson et al. |
| 7,343,487 B2 | 3/2008 | Lindqvist et al. |
| 7,356,549 B1 | 4/2008 | Bruso et al. |
| 7,376,074 B2 | 5/2008 | Jung et al. |
| 7,376,186 B2 | 5/2008 | Boyce et al. |
| 7,400,820 B2 | 7/2008 | Uchida et al. |
| 7,440,410 B2 | 10/2008 | Ojard et al. |
| 7,440,516 B2 | 10/2008 | Kim et al. |
| 7,450,613 B2 | 11/2008 | Choi et al. |
| 7,450,628 B2 | 11/2008 | Feher |
| 7,454,683 B2 | 11/2008 | Vesma et al. |
| 7,460,606 B2 | 12/2008 | Choi et al. |
| 7,474,695 B2 | 1/2009 | Liu et al. |
| 7,590,187 B2 | 9/2009 | Jeong et al. |
| 7,590,917 B2 | 9/2009 | Barry et al. |
| 7,593,474 B2 | 9/2009 | Jeong et al. |
| 7,620,118 B2 | 11/2009 | Choi |
| 7,634,006 B2 | 12/2009 | Choi et al. |
| 7,653,143 B2 | 1/2010 | Kim et al. |
| 7,675,994 B2 | 3/2010 | Gaddam et al. |
| 7,698,621 B2 | 4/2010 | Choi et al. |
| 7,705,920 B2 | 4/2010 | Lee et al. |
| 7,733,426 B2 | 6/2010 | Lee et al. |
| 7,733,819 B2 | 6/2010 | Lee et al. |
| 7,733,820 B2 | 6/2010 | Choi et al. |
| 7,764,323 B2 | 7/2010 | Choi et al. |
| 7,779,337 B2 | 8/2010 | Song et al. |
| 7,783,960 B2 | 8/2010 | Choi et al. |
| 7,796,697 B2 | 9/2010 | Kim et al. |
| 7,797,607 B2 | 9/2010 | Choi et al. |
| 7,840,882 B2 | 11/2010 | Lee et al. |
| 7,876,835 B2 | 1/2011 | Kim et al. |
| 7,890,980 B2 | 2/2011 | Yun et al. |
| 7,932,956 B2 | 4/2011 | Choi et al. |
| 2001/0011213 A1 | 8/2001 | Hindie et al. |
| 2001/0034867 A1 | 10/2001 | Jaffe et al. |
| 2002/0046406 A1 | 4/2002 | Chelehmal et al. |

| Publication No. | Date | Inventor |
|---|---|---|
| 2002/0051087 A1* | 5/2002 | Limberg et al. ............... 348/611 |
| 2002/0080992 A1 | 6/2002 | Decker et al. |
| 2002/0085632 A1 | 7/2002 | Choi et al. |
| 2002/0089078 A1 | 7/2002 | Suzuki et al. |
| 2002/0122511 A1 | 9/2002 | Kwentus et al. |
| 2002/0126222 A1 | 9/2002 | Choi et al. |
| 2002/0136197 A1 | 9/2002 | Owen et al. |
| 2002/0141440 A1 | 10/2002 | Stanley et al. |
| 2002/0150167 A1 | 10/2002 | Demjanenko et al. |
| 2002/0150246 A1 | 10/2002 | Ogina |
| 2002/0154620 A1 | 10/2002 | Azenkot et al. |
| 2002/0154709 A1 | 10/2002 | Choi et al. |
| 2002/0159520 A1 | 10/2002 | Choi et al. |
| 2002/0172154 A1 | 11/2002 | Uchida et al. |
| 2002/0186780 A1 | 12/2002 | Choi et al. |
| 2002/0186790 A1 | 12/2002 | Choi et al. |
| 2002/0187767 A1 | 12/2002 | Meehan |
| 2002/0191716 A1 | 12/2002 | Xia et al. |
| 2002/0194570 A1 | 12/2002 | Birru et al. |
| 2003/0046431 A1 | 3/2003 | Belleguie |
| 2003/0067899 A9 | 4/2003 | Chen et al. |
| 2003/0093798 A1 | 5/2003 | Rogerson |
| 2003/0099303 A1 | 5/2003 | Birru et al. |
| 2003/0137765 A1 | 7/2003 | Yamazaki et al. |
| 2003/0152107 A1 | 8/2003 | Pekonen |
| 2003/0206053 A1 | 11/2003 | Xia et al. |
| 2003/0223519 A1 | 12/2003 | Jeong et al. |
| 2003/0234890 A1 | 12/2003 | Bae et al. |
| 2004/0022278 A1 | 2/2004 | Thomas et al. |
| 2004/0028076 A1 | 2/2004 | Strolle et al. |
| 2004/0034491 A1 | 2/2004 | Kim |
| 2004/0061645 A1 | 4/2004 | Seo et al. |
| 2004/0071241 A1 | 4/2004 | Bouillet et al. |
| 2004/0090997 A1 | 5/2004 | Choi et al. |
| 2004/0100588 A1 | 5/2004 | Hartson et al. |
| 2004/0101046 A1 | 5/2004 | Yang et al. |
| 2004/0105507 A1 | 6/2004 | Chang et al. |
| 2004/0110522 A1 | 6/2004 | Howard et al. |
| 2004/0125235 A1* | 7/2004 | Kim et al. ............... 348/607 |
| 2004/0141457 A1 | 7/2004 | Seo et al. |
| 2004/0148642 A1 | 7/2004 | Park et al. |
| 2004/0156460 A1 | 8/2004 | Kim et al. |
| 2004/0181800 A1 | 9/2004 | Rakib et al. |
| 2004/0184547 A1 | 9/2004 | Choi et al. |
| 2004/0246373 A1 | 12/2004 | Kadono et al. |
| 2004/0260985 A1 | 12/2004 | Krieger |
| 2005/0013380 A1 | 1/2005 | Kim et al. |
| 2005/0024543 A1 | 2/2005 | Ramaswamy et al. |
| 2005/0031097 A1 | 2/2005 | Rabenko et al. |
| 2005/0049923 A1 | 3/2005 | Tanaka et al. |
| 2005/0058192 A1 | 3/2005 | Lee |
| 2005/0090235 A1 | 4/2005 | Vermola et al. |
| 2005/0097428 A1 | 5/2005 | Chang et al. |
| 2005/0111586 A1 | 5/2005 | Kang et al. |
| 2005/0129132 A1 | 6/2005 | Choi et al. |
| 2005/0132413 A1 | 6/2005 | Barreyro et al. |
| 2005/0141606 A1 | 6/2005 | Choi et al. |
| 2005/0152446 A1 | 7/2005 | Choi et al. |
| 2005/0157758 A1 | 7/2005 | Yoo |
| 2005/0162886 A1 | 7/2005 | Jeong et al. |
| 2005/0172208 A1 | 8/2005 | Yoon |
| 2005/0175080 A1 | 8/2005 | Bouillett |
| 2005/0218237 A1 | 10/2005 | Lapstun et al. |
| 2005/0249300 A1 | 11/2005 | Jeong et al. |
| 2005/0249301 A1 | 11/2005 | Jeong et al. |
| 2005/0271158 A1 | 12/2005 | Birru |
| 2006/0015914 A1 | 1/2006 | Lee |
| 2006/0029159 A1 | 2/2006 | Oh et al. |
| 2006/0039460 A1 | 2/2006 | Fimoff et al. |
| 2006/0039503 A1 | 2/2006 | Choi et al. |
| 2006/0052052 A1 | 3/2006 | Jung et al. |
| 2006/0053436 A1 | 3/2006 | Allwein et al. |
| 2006/0072623 A1 | 4/2006 | Park |
| 2006/0078003 A1 | 4/2006 | Watanabe et al. |
| 2006/0078071 A1 | 4/2006 | Lee |
| 2006/0078072 A1 | 4/2006 | Cheon et al. |
| 2006/0085726 A1 | 4/2006 | Rhee et al. |
| 2006/0104391 A1 | 5/2006 | Choi et al. |
| 2006/0126757 A1 | 6/2006 | Choi et al. |
| 2006/0130099 A1 | 6/2006 | Rooyen |
| 2006/0133429 A1 | 6/2006 | Seo et al. |
| 2006/0140301 A1 | 6/2006 | Choi et al. |
| 2006/0146797 A1 | 7/2006 | Lebizay |
| 2006/0146955 A1 | 7/2006 | Choi et al. |
| 2006/0159183 A1 | 7/2006 | Gaddam et al. |
| 2006/0181797 A1 | 8/2006 | Sugawara et al. |
| 2006/0203127 A1 | 9/2006 | Choi et al. |
| 2006/0203944 A1 | 9/2006 | Kwak et al. |
| 2006/0212910 A1 | 9/2006 | Endres et al. |
| 2006/0223461 A1 | 10/2006 | Laroia et al. |
| 2006/0245488 A1 | 11/2006 | Puputti et al. |
| 2006/0245505 A1 | 11/2006 | Limberg |
| 2006/0246836 A1 | 11/2006 | Simon |
| 2006/0248563 A1 | 11/2006 | Lee et al. |
| 2006/0253890 A9 | 11/2006 | Park et al. |
| 2006/0262227 A1 | 11/2006 | Jeong |
| 2006/0262744 A1 | 11/2006 | Xu et al. |
| 2006/0262863 A1 | 11/2006 | Park et al. |
| 2006/0268673 A1 | 11/2006 | Roh et al. |
| 2006/0269012 A1 | 11/2006 | Kim et al. |
| 2006/0285608 A1 | 12/2006 | Kim et al. |
| 2007/0019579 A1 | 1/2007 | Xu et al. |
| 2007/0053606 A1 | 3/2007 | Ali |
| 2007/0071110 A1 | 3/2007 | Choi et al. |
| 2007/0092027 A1 | 4/2007 | Yu et al. |
| 2007/0092043 A1 | 4/2007 | Yu et al. |
| 2007/0094566 A1 | 4/2007 | Park et al. |
| 2007/0094567 A1 | 4/2007 | Park et al. |
| 2007/0098114 A1 | 5/2007 | Hundhausen |
| 2007/0113145 A1 | 5/2007 | Yu et al. |
| 2007/0121681 A1 | 5/2007 | Kang et al. |
| 2007/0127598 A1 | 6/2007 | Kang et al. |
| 2007/0130495 A1 | 6/2007 | Yoon et al. |
| 2007/0135166 A1* | 6/2007 | Ding et al. ............... 455/561 |
| 2007/0136643 A1 | 6/2007 | Kang et al. |
| 2007/0140368 A1 | 6/2007 | Kim et al. |
| 2007/0140384 A1 | 6/2007 | Choi et al. |
| 2007/0147432 A1 | 6/2007 | Kang et al. |
| 2007/0147549 A1 | 6/2007 | Choi et al. |
| 2007/0147550 A1 | 6/2007 | Choi et al. |
| 2007/0168844 A1 | 7/2007 | Jeong et al. |
| 2007/0172003 A1 | 7/2007 | Kim et al. |
| 2007/0195889 A1 | 8/2007 | Hong et al. |
| 2007/0201544 A1 | 8/2007 | Zhu et al. |
| 2007/0211769 A1 | 9/2007 | Lee et al. |
| 2007/0217499 A1 | 9/2007 | Limberg |
| 2007/0217551 A1 | 9/2007 | Kang et al. |
| 2007/0230580 A1 | 10/2007 | Kim et al. |
| 2007/0230607 A1 | 10/2007 | Yu et al. |
| 2007/0248055 A1 | 10/2007 | Jain et al. |
| 2007/0253502 A1 | 11/2007 | Park et al. |
| 2007/0268979 A1 | 11/2007 | Chang et al. |
| 2008/0008155 A1 | 1/2008 | Yoon et al. |
| 2008/0019466 A1 | 1/2008 | Limberg |
| 2008/0063089 A1 | 3/2008 | Chen |
| 2008/0069147 A1 | 3/2008 | Lee et al. |
| 2008/0080082 A1 | 4/2008 | Erden et al. |
| 2008/0095096 A1 | 4/2008 | Cho et al. |
| 2008/0112479 A1 | 5/2008 | Garmany et al. |
| 2008/0134007 A1 | 6/2008 | Lee et al. |
| 2008/0137525 A1 | 6/2008 | Liu |
| 2008/0151937 A1 | 6/2008 | Lee et al. |
| 2008/0152035 A1 | 6/2008 | Lee et al. |
| 2008/0159279 A1 | 7/2008 | Younis et al. |
| 2008/0170162 A1 | 7/2008 | Kim et al. |
| 2008/0239161 A1 | 10/2008 | Kim et al. |
| 2008/0240293 A1 | 10/2008 | Kim et al. |
| 2008/0267307 A1 | 10/2008 | Chang et al. |
| 2008/0273589 A1 | 11/2008 | Kim et al. |
| 2008/0279270 A1 | 11/2008 | Zeng |
| 2009/0028230 A1 | 1/2009 | Leitner |
| 2009/0034629 A1 | 2/2009 | Suh et al. |
| 2009/0037794 A1 | 2/2009 | Choi et al. |
| 2009/0059086 A1 | 3/2009 | Lee et al. |
| 2009/0060097 A1 | 3/2009 | Kim et al. |
| 2009/0077588 A1 | 3/2009 | Sugai |
| 2009/0111486 A1 | 4/2009 | Burstrom |
| 2009/0201997 A1 | 8/2009 | Kim et al. |

| | | |
|---|---|---|
| 2009/0262799 A1 | 10/2009 | Limberg |
| 2009/0285137 A1 | 11/2009 | Fujita et al. |
| 2010/0061476 A1 | 3/2010 | Kim et al. |
| 2010/0118206 A1 | 5/2010 | Gao et al. |
| 2010/0180294 A1 | 7/2010 | Yun et al. |
| 2010/0226392 A1 | 9/2010 | Lee et al. |
| 2010/0309969 A1 | 12/2010 | Kim et al. |
| 2010/0310015 A1 | 12/2010 | Choi et al. |
| 2010/0316110 A1 | 12/2010 | Choi et al. |

FOREIGN PATENT DOCUMENTS

| | | |
|---|---|---|
| CN | 1533174 | 9/2004 |
| CN | 1582580 | 2/2005 |
| EP | 0526833 | 2/1993 |
| EP | 1566905 | 8/2005 |
| EP | 1628420 | 2/2006 |
| JP | 2000224136 | 8/2000 |
| JP | 2001274769 | 10/2001 |
| JP | 2002218339 | 8/2002 |
| JP | 2003032640 | 1/2003 |
| JP | 2003209525 | 7/2003 |
| JP | 2003284037 | 10/2003 |
| JP | 2004129126 | 4/2004 |
| JP | 2006148543 | 6/2006 |
| JP | 2007096403 | 4/2007 |
| KR | 1020000040481 | 7/2000 |
| KR | 1020030026236 | 3/2003 |
| KR | 1020030037138 | 5/2003 |
| KR | 20040032283 | 4/2004 |
| KR | 1020050065898 | 6/2005 |
| KR | 1020050093921 | 9/2005 |
| KR | 10-2005-0097438 | 10/2005 |
| KR | 1020060009737 | 2/2006 |
| KR | 1020060012510 | 2/2006 |
| KR | 1020060039728 | 5/2006 |
| KR | 1020060063867 | 6/2006 |
| KR | 1020060065435 | 6/2006 |
| KR | 1020060068989 | 6/2006 |
| KR | 1020060070665 | 6/2006 |
| KR | 1020060072573 | 6/2006 |
| KR | 1020060095126 | 8/2006 |
| KR | 1020060095235 | 8/2006 |
| KR | 1020060102160 | 9/2006 |
| KR | 1020060117484 | 11/2006 |
| KR | 1020060133011 | 12/2006 |
| KR | 1020070007995 | 1/2007 |
| KR | 1020070034215 | 3/2007 |
| KR | 1020070068960 | 7/2007 |
| WO | 99/21323 | 4/1999 |
| WO | 02/37744 | 5/2002 |
| WO | 2006003531 | 1/2006 |
| WO | 2006/093389 | 9/2006 |
| WO | 2007/008028 | 1/2007 |
| WO | 2007/091779 | 8/2007 |
| WO | 2008105587 | 9/2008 |

OTHER PUBLICATIONS

Advanced Television Systems Commitee; "Recommended practice: Guide to the Use of the ATSC Digital Television Standard, Including Corrigendum No. 1"; Doc A/54A; Dec. 4, 2003.

DVB-H Implementation Guidelines; DVB Document A092 Rev. 02, May 2007.

ISO/IEC; "Information Technology—Generic Coding of Moving Pictures and Associated Audio Information: Systems" ISO/IEC 13818-1 International Standard; Second Edition; Dec. 1, 2000.

Federal Information Processing Standards Publication 197; Announcing the Advanced Encryption Standard (AES); Nov. 26, 2001.

Advanced Television Systems Committee; "ATSC Recommended Practice: E-VSB Implementation Guidelines"; Doc A/112, Apr. 18, 2006.

Graell, A. ; "Analysis and Design of Rate Compatible Serial Concatenated Convolution Codes"; Proceedings of the 2005 International Symposium on Information Theory; pp. 607-611; Sep. 4, 2005.

European Telecommunication Standards Institute (ETSI); "Digital Video Broadcasting (DVB); DVB-H Implementation Guidelines"; ETSI TR 102 377 V 1.2.1, Nov. 2005.

European Telecommunication Standards Institute (ETSI); "Radio Broadcasting Systems; Digital Audio Broadcasting (DAB) to Mobile, Portable and Fixed Receivers"; ETSI EN 300 401 V1.4.1 ., Jun. 2006.

Fimoff, M, et al.; "E-VSB Map Signaling", IEEE Transactions on Consumer Electronics; vol. 49; Issue 3; pp. 515-518; Aug. 2003.

Uehara, M., et al.; "Transmission Scheme for the Terrestrial ISDB System"; IEEE Transactions on Consumer Electronics; vol. 45; Issue 1; Feb. 1999.

Advanced Television Systems Committee; "ATSC Standard; Digital Television Standard (A/53), Revision D, Including Amendment No. 1"; Doc A/53D; Jul. 19, 2005.

Meyers, et al.; "Joint Carrier Phase and Symbol Timing Recovery for PAM Systems"; IEEE Transactions on Communications; vol. COM-28; No. 8; pp. 1121-1129; Aug. 1, 1980; XP000758588.

Yao, J., "IP Datacasting and Channel Error Handling With DVB-H", Proceedings of the 2005 Emerging Information Technology Conference; XP-010856441; Aug. 15, 2005.

Kim, Sung-Hoon et al.; "Enhanced-x VSB System Development for Improving ATSC Terrestrial DTV Transmission Standard", IEEE Transactions on Broadcasting, vol. 52, No. 2, Jun. 2006.

Touzni, A., et al.; "Enhanced 8-VSB Transmission for North American HDTV Terrestrial Broadcast"; Proceedings on the 2003 IEEE International Conference on Acoustics, Speech and Signal Processing; vol. 2; pp. 437-440; XP010640975; Apr. 2003.

Gaddam, V.R.; "A Newly Proposed ATSC DTV System for Transmitting a Robust Bit-Stream Along With the Standard Bit-Stream", IEEE Transactions of Consumer Electronics; XP001201224; vol. 49; Issue 4; Nov. 2003.

Hopkins, R., "Digital Terrestrial HDTV for North America—The Grand Alliance HDTV System," European Broadcasting Union (EBU) Review Technical, XP-000438385, pp. 36-50, Aug. 1994.

Lambrette, U., et al., "Variable Sample Rate Digital Feedback NDA Timing Synchronization," Global Telecommunications Conference on Communications: The Key to Global Prosperity, vol. 2, pp. 1348-1352, Nov. 1996.

Kim et al., "Non-Systematic RS Encoder Design for a Parity Replacer of ATSC-M/H System," IEEE Transactions on Consumer Electronics, vol. 56, No. 3, pp. 1270-1274, Aug. 2010.

Bretl et al., "ATSC RF, Modulation, and Transmission," Proceedings of the IEEE, vol. 94, No. 1, pp. 44-59, Jan. 2006.

Bretl et al., "E-VSB—AN 8-VSB Compatible System with Improved White Noise and Multipath Performance," IEEE Transactions on Consumer Electronics, vol. 47, No. 3, pp. 307-312, Aug. 2001.

Kim et al., "Enhanced-xVSB System Development for Mobile/Portable Reception," International Conference on Consumer Electronics—Digest of Technical Papers, pp. 419-420, Jan. 2005.

* cited by examiner

CHANNEL EQUALIZER AND METHOD OF PROCESSING BROADCAST SIGNAL IN DTV RECEIVING SYSTEM

CROSS-REFERENCE TO RELATED APPLICATIONS

This application is a continuation of U.S. application Ser. No. 11/674,099, filed on Feb. 12, 2007, now U.S. Pat. No. 7,876,835, which claims the benefit of earlier filing date and right of priority to Korean Patent Application Nos. 10-2006-0013128, filed on Feb. 10, 2006, 10-2006-0089736, filed on Sep. 15, 2006, and U.S. Provisional Application No. 60/883,154, filed on Jan. 2, 2007, the contents of which are hereby incorporated by reference herein in their entirety.

BACKGROUND OF THE INVENTION

1. Field of the Invention

The present invention relates to a digital telecommunications system, and more particularly, to a channel equalizer and a method of processing broadcast signal in DTV receiving system.

2. Discussion of the Related Art

Presently, the technology for processing digital signals is being developed at a vast rate, and, as a larger number of the population uses the Internet, digital electric appliances, computers, and the Internet are being integrated. Therefore, in order to meet with the various requirements of the users, a system that can transmit diverse supplemental information in addition to video/audio data through a digital television channel needs to be developed.

Some users may assume that supplemental data broadcasting would be applied by using a PC card or a portable device having a simple in-door antenna attached thereto. However, when used indoors, the intensity of the signals may decrease due to a blockage caused by the walls or disturbance caused by approaching or proximate mobile objects. Accordingly, the quality of the received digital signals may be deteriorated due to a ghost effect and noise caused by reflected waves. However, unlike the general video/audio data, when transmitting the supplemental data, the data that is to be transmitted should have a low error ratio. More specifically, in case of the video/audio data, errors that are not perceived or acknowledged through the eyes or ears of the user can be ignored, since they do not cause any or much trouble. Conversely, in case of the supplemental data (e.g., program execution file, stock information, etc.), an error even in a single bit may cause a serious problem. Therefore, a system highly resistant to ghost effects and noise is required to be developed.

The supplemental data are generally transmitted by a time-division method through the same channel as the video/audio data. However, with the advent of digital broadcasting, digital television receiving systems that receive only video/audio data are already supplied to the market. Therefore, the supplemental data that are transmitted through the same channel as the video/audio data should not influence the conventional receiving systems that are provided in the market. In other words, this may be defined as the compatibility of broadcast system, and the supplemental data broadcast system should be compatible with the broadcast system. Herein, the supplemental data may also be referred to as enhanced data. Furthermore, in a poor channel environment, the receiving performance of the conventional receiving system may be deteriorated. More specifically, resistance to changes in channels and noise is more highly required when using portable and/or mobile receiving systems.

SUMMARY OF THE INVENTION

Accordingly, the present invention is directed to a channel equalizer and a method of processing broadcast signal in DTV receiving system that substantially obviates one or more problems due to limitations and disadvantages of the related art.

An object of the present invention is to provide a digital broadcast system that is suitable for transmitting supplemental data and that is highly resistant to noise.

A further object of the present invention is to provide a channel equalizer and a method of processing broadcast signal in DTV receiving system that can use pre-defined known data that are already known by a receiving system and/or a transmitting system, thereby enhancing the receiving performance of the digital broadcast (or television) receiving system.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a channel equalizer for use in a digital television (DTV) receiving system includes a first transformer, an estimator, an average calculator, a second transformer, a coefficient calculator, a compensator, and a third transformer. The first transformer converts normal data in a broadcast signal into frequency domain data. A known data sequence is periodically repeated in the normal data. The estimator estimates channel impulse responses during intervals in which first and second known data sequences located before and after each normal data block in the broadcast signal are received. The average calculator calculates an average value of the estimated channel impulses, and the second transformer converts the average value into frequency domain data. The coefficient calculator calculates equalization coefficients using the average value in the frequency domain. The compensator compensates channel distortion of each normal data block in the frequency domain by multiplying each normal data block with the equalization coefficients. Finally, the third transformer converts the compensated normal data block into time domain data.

In another aspect of the present invention, a channel equalization for use in a digital television (DTV) receiving system includes an overlap unit, a first transformer, an estimator, a second transformer, a calculator, a compensator, a third transformer, and a save unit. The overlap unit overlaps normal data in a broadcast signal at a predetermined overlap ratio. A known data sequence is periodically repeated in the normal data. The first transformer converts the overlapped normal data into frequency domain data. The estimator estimates a channel impulse response using the known data sequence, and the second transformer converts the estimated channel impulse response into frequency domain data. The calculator calculates equalization coefficients using the estimated channel impulse response in the frequency domain. The compensator compensates channel distortion of the normal data in the frequency domain by multiplying the normal data with the equalization coefficients. The third transformer converts the compensated normal data into time domain data, and the save unit saves the compensated normal data in the time domain.

In another aspect of the present invention, a channel equalizer for use in a DTV receiving system includes an overlap unit, a first transformer, an estimator, an interpolator, a second transformer, a calculator, a compensator, a third transformer, and a save unit. The overlap unit overlaps normal data in a broadcast signal at a predetermined overlap ratio. A known data sequence is periodically repeated in the normal data. The first transformer converts the overlapped normal data into frequency domain data. The estimator estimates a first channel impulse response during a known data interval, and the interpolator estimates a second channel impulse response during a normal data interval by interpolating the first channel impulse response. The second transformer converts the estimated second channel impulse response into frequency domain data. The calculator calculates equalization coefficients using the second channel impulse response in the frequency domain. The compensator compensates channel distortion of the normal data in the frequency domain by multiplying the normal data with the equalization coefficients. The third transformer converts the compensated normal data into time domain data. Finally, the save unit saves the compensated formal data in the time domain.

In another aspect of the present invention, a channel equalizer for use in a DTV receiving system includes an overlap unit, a first transformer, a compensator, a second transformer, a save unit, an error calculator, a padding unit, a third transformer, and a coefficient update unit. The overlap unit overlaps normal data in broadcast signal at a predetermined overlap ratio. A known data sequence is periodically repeated in the normal data. The first transformer converts the overlapped normal data into frequency domain data. The compensator compensates channel distortion of the normal data in the frequency domain by multiplying the normal data with equalization coefficients. The second transformer converts the compensated normal data into time domain data. The save unit saves the compensated normal data in the time domain. The error calculator calculates an error of the saved normal data using a decision value of the saved normal data and the known data sequence. The padding unit pads zeros into the error according to the overlap ratio. The third transformer converts the zero-padded error into frequency domain data. The coefficient update unit updates the equalization coefficients based on the zero-padded error in the frequency domain.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts. In addition, although the terms used in the present invention are selected from generally known and used terms, some of the terms mentioned in the description of the present invention have been selected by the applicant at his or her discretion, the detailed meanings of which are described in relevant parts of the description herein. Furthermore, it is required that the present invention is understood, not simply by the actual terms used but by the meaning of each term lying within.

In the present invention, the enhanced data may either consist of data including information such as program execution files, stock information, weather forecast, and so on, or consist of video/audio data. Additionally, the known data refer to data already known based upon a pre-determined agreement between the transmitting system and the receiving system. Furthermore, the main data consist of data that can be received from the conventional receiving system, wherein the main data include video/audio data. The present invention relates to performing channel equalization in a frequency domain by using the known data known already known by the transmitting system and receiving system. More specifically, in the digital broadcast receiving system that multiplexes and transmits the enhanced data having information with the main data, known data known that are already known by the transmitting system and receiving system may be inserted in an enhanced data packet section and then transmitted. In order to enhance the receiving performance, an error correction signal having a higher performance than that of the main data section is applied to the data transmitted from the enhanced data packet section. At this point, the known data may be inserted in the enhanced data packet section in various formats. Additionally, the known data may be used in the digital broadcast receiving system for carrier recovery, frame synchronization recovery, and channel equalization processes.

Figure 1:
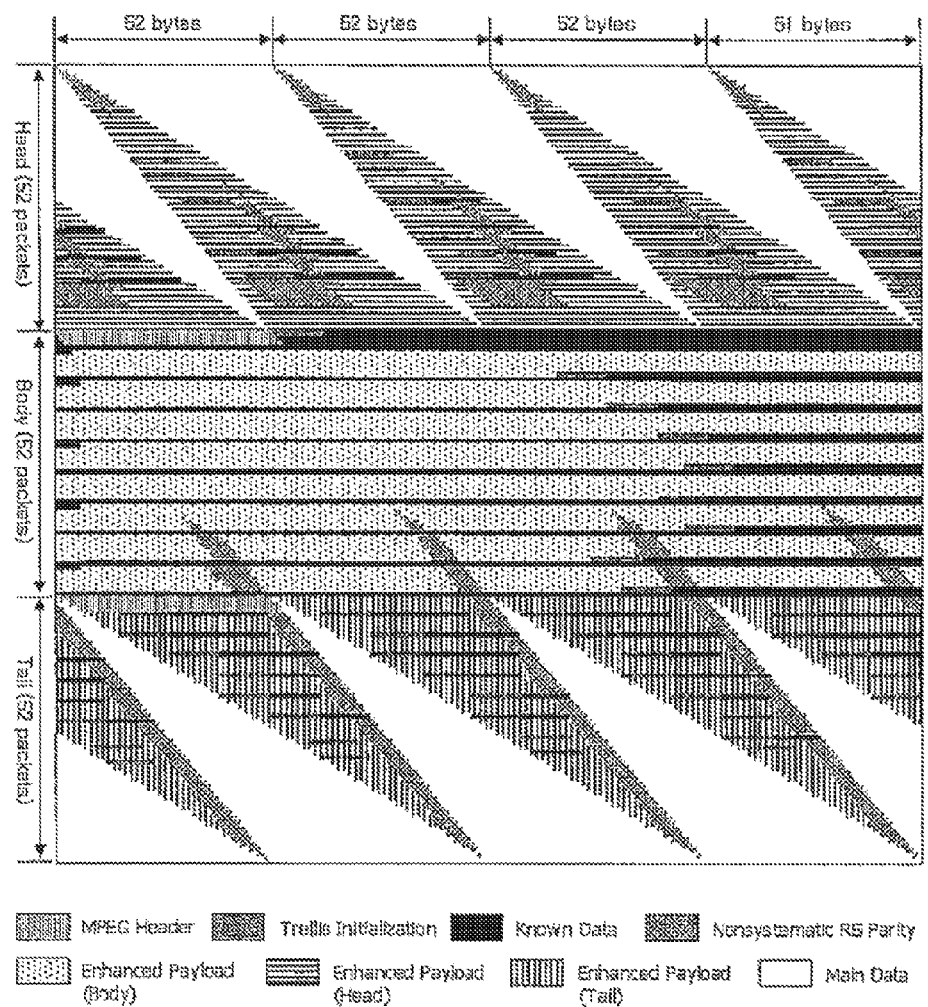
FIG. 1 illustrates an example of a data frame structure after data interleaving in a digital broadcast transmitting system according to the present invention.

FIG. 1 illustrates an example of a data frame structure corresponding to the output of a data interleaver (not shown) in a digital broadcast transmitting system according to the present invention. Particularly, FIG. 1 illustrates an example of a predetermined number of data packets gathered (or grouped) so as to be divided in to head, body, and tail areas. Herein, the head, body, and tail areas are each divided in 52-packet units. FIG. 1 illustrates an example of each area being configured of 52 packets, because the data interleaver operates periodically after a cycle of packets. With respect to the output of the data interleaver, the body area within the data frame is allocated to include at least a portion or the entire area in which enhanced data are consecutively outputted. In the body area, the known data are periodically inserted at a constant rate. The head area is located before the body area, and the tail area is located after the body area. For example, referring to FIG. 1, the main data are not included in the body area, and the known data are inserted after each 6-packet (or segment) cycle. Furthermore, the known data are additionally inserted at the beginning of the body area.

In this case, the body area may show a stronger receiving performance, since there is no interference from the main data. The enhanced data of the head and tail areas are mixed with the main data in accordance with the output order from the data interleaver. Accordingly, the receiving performance in the head and tail areas is more deteriorated than in the body area. Therefore, when known data are inserted in the enhanced data and then transmitted, and when consecutive and long known data are to be periodically inserted in the enhanced data, the known data may be inserted in the body area. This is because, based upon the output order of the data interleaver, the enhanced data are not mixed with the main data. At this point, known data having a predetermined length may be periodically inserted in the body area. However, it is difficult to periodically insert known data in the head and tail areas, and it is also difficult to insert consecutive and long known data. Therefore, FIG. 1 corresponds to an example of inserting short known data sequences in the head and tail areas at frequent cycle periods.

Figure 2:
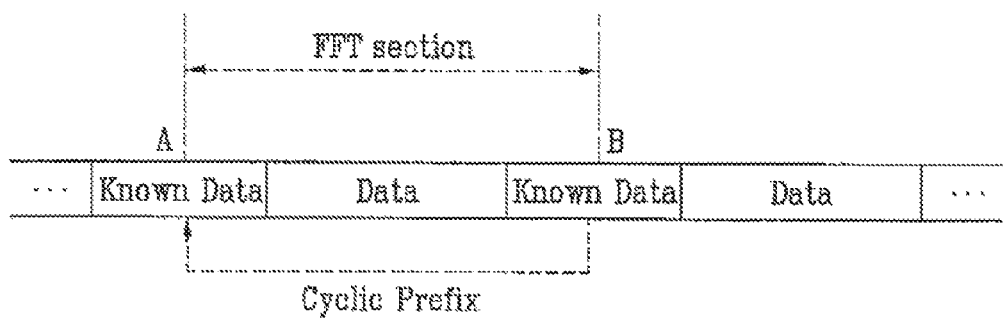
FIG. 2 illustrates an example of known data being periodically transmitted according to the present invention.

FIG. 2 illustrates an example of a data structure having known data sequences of the same patterns periodically inserted therein and being transmitted. Referring to FIG. 2, the data correspond to one of enhanced data, main data, and a combination of enhanced data and main data. In the present invention, in order to be differentiated with the known data, the above-described data will be referred to as general data for simplicity. Accordingly, when the known data are regularly inserted in the valid data as described above, the channel equalizer included in the digital broadcast receiving system used the inserted known data as a training sequence, so as to be used either for an accurate decision value or for estimating an impulse response of a channel. Meanwhile, when the same known data are regularly inserted, the known data interval may be used as a guard interval in a channel equalizer according to the present invention. More specifically, since identical known data appear repeatedly, the known data area may be used as the guard interval. Herein, the guard interval prevents interference that occurs between blocks due to a multiple path channel.

The above-described structure is referred to as a cyclic prefix. This structure provides circular convolution to an impulse response in a time domain between a data block transmitted from the digital broadcast transmitting system and a channel. Accordingly, this facilitates the channel equalizer of a digital broadcast receiving system to perform channel equalization in a frequency domain by using a fast fourier transform (FFT) and an inverse fast fourier transform (IFFT). More specifically, when viewed in the frequency domain, the data block received by the digital broadcast receiving system is expressed as a multiplication of the data block and the channel impulse response. Therefore, when performing the channel equalization, by multiplying the inverse of the channel in the frequency domain, the channel equalization may be performed more easily.

The channel equalizer according to the present invention may uses an indirect equalization method, in which the channel equalizer uses known data sequences, which are positioned based on a regular cycle period, in order to estimate a channel impulse response (CIR) and to use the estimated CIR to perform the channel equalization process. Herein, indirect equalization method refers to estimating the impulse response of a channel so as to calculate an equalization coefficient, thereby performing the channel equalization process. Alternatively, direct equalization method refers to calculating or detecting an error from a channel equalized signal so as to renew (or update) an equalization coefficient, thereby performing the channel equalization process.

Figure 3:
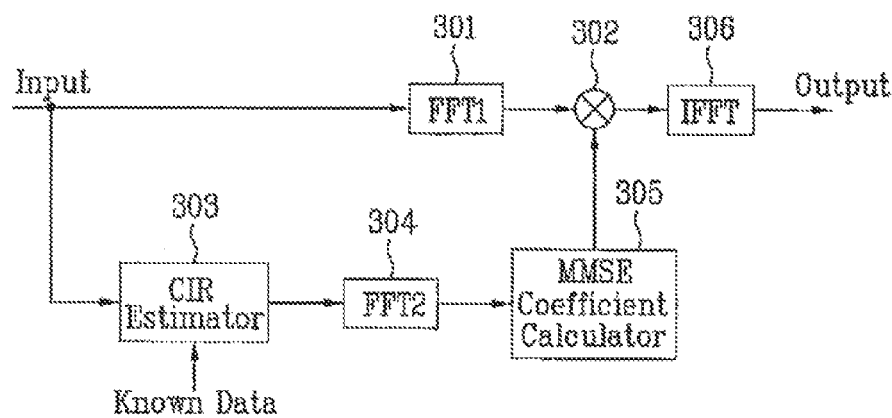
FIG. 3 illustrates a block diagram of a channel equalizer according to a first embodiment of the present invention.

FIG. 3 illustrates a block diagram of a channel equalizer according to a first embodiment of the present invention. More specifically, FIG. 3 illustrates a block diagram of a frequency domain channel equalizer using an indirect equalization method according to the present invention. Referring to FIG. 3, the channel equalizer includes a first fast fourier transform (FFT) unit FFT1 301, a distortion compensator 302, a channel estimator 303, a second FFT unit FFT2 304, a MMSE coefficient calculator 305, and an inverse fast fourier transform (IFFT) unit 306. Herein, any device performing complex number multiplication may be used as the distortion compensator 302.

In the channel equalizer having the above-described structure, as shown in FIG. 3, the first FFT unit 301 performs a FFT process on the received data so as to convert the data to frequency domain data. The frequency domain data are then outputted to the distortion compensator 302. At this point, if known data sequences having the same patterns are periodically inserted in general data sequences and then transmitted, the first FFT unit 301 performs FFT on the received data by FFT block units, thereby converting the received data to frequency domain data. The distortion compensator 302 performs complex multiplication on the equalization coefficient calculated from the MMSE coefficient calculator 305 and the frequency domain data, thereby compensating the channel distortion of the data being outputted from the first FFT unit 301. Thereafter, the distortion-compensated data are outputted to the IFFT unit 306. The IFFT unit 306 performs inverse fast fourier transform (IFFT) on the distortion-compensated data, so as to convert the corresponding data back to the time domain data and then outputted.

Meanwhile, the channel estimator 303 estimates the CIR by using the data received during the known data section and the known data of the known data section, wherein the known data are already known by the receiving system in accordance with an agreement between the receiving system and the transmitting system. Then, the estimated CIR is outputted to the second FFT unit 304. For example, the channel estimator 303 estimated an impulse response of a discrete equalization channel. Herein, it is assumed that the signal being transmitted from the transmitting system during the known data section has passed through the discrete equalization channel. Thereafter, the estimated impulse response of the discrete equalization channel is outputted to the second FFT unit 304.

The second FFT unit 304 performs FFT on the estimated CIR in order to convert the estimated CIR to the frequency domain CIR. Then, the second FFT unit 304 outputs the converted CIR to the MMSE coefficient calculator 305. The MMSE coefficient calculator 305 uses the CIR of the frequency domain in order to calculate the equalization coefficient and to output the calculated equalization coefficient to the distortion compensator 302. Herein, the MMSE coefficient calculator 305 is merely an exemplary part of the channel equalizer according to the first embodiment of the present invention. At this point, the MMSE coefficient calculator 305 calculates a channel equalization coefficient of the frequency domain that can provide minimum mean square error (MMSE) from the estimated CIR of the frequency domain. The calculated channel equalization coefficient is outputted to the distortion compensator 302.

Meanwhile, as described above, when the input data are converted to frequency domain data by the first FFT unit 301, the FFT block section should be configured so that part of the known data of the known data section is located both in front of and behind the general data section, as shown in FIG. 2. Thus, the influence of the channel may occur in the form of circular convolution, thereby allowing channel equalization to be performed correctly. However, when equalization is performed by the channel equalizer shown in FIG. 3, and when the CIR of point A and the CIR of point B (both shown in FIG. 2) are used for the equalization process, the point of the general data to which the actual equalization is applied and the point of the CIR used in the equalization process do not coincide with one another. This leads to a deficiency in the performance of the equalizer. More specifically, this is because the CIR is the value calculated (or obtained) from the known data section, and because the channel equalization process of the general data section is performed by using the CIR calculated (or obtained) from the known data section.

Figure 4:
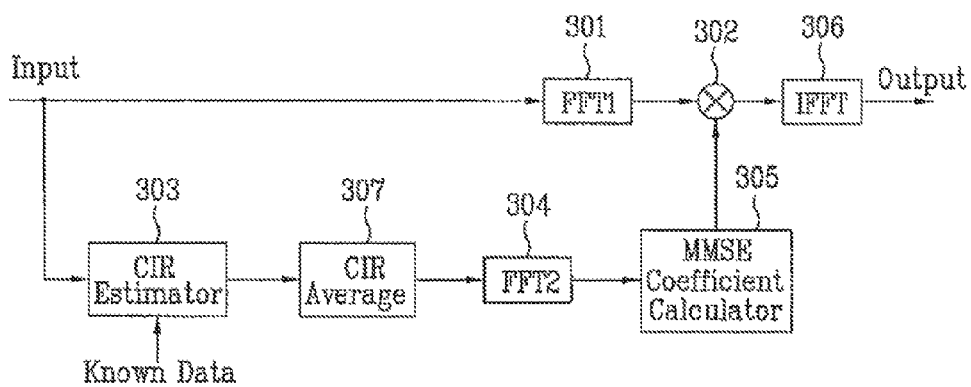
FIG. 4 illustrates a block diagram of a channel equalizer according to a second embodiment of the present invention.

In order to resolve such problems, another example of a channel equalizer is presented in FIG. 4. FIG. 4 illustrates a block diagram of a channel equalizer of the frequency domain according to a second embodiment of the present invention. Herein, an average value of the CIRs is used for channel equalizing the general data. More specifically, when performing the equalization process, an average value of the CIR of point A and the CIR of point B is used to perform a channel equalization process on the general data section between point A and point B, thereby enhancing the equalization performance. Accordingly, the channel equalizer shown in FIG. 4 further includes an average calculator 307 between the channel estimator 303 and the second FFT unit 304 of FIG. 3.

More specifically, the channel estimator 303 estimates the CIR by using the data received during the known data section and the known data. Then, the estimated CIR is outputted to the average calculator 307. Herein, the average calculator 307 calculates an average value of the consecutive CIRs that are being inputted and, then, outputs the calculated average value to the second FFT unit 304. For example, the average value between the CIR value estimated at point A and the CIR value estimated at point B is calculated, so that the calculated average value can be used in the channel equalization process of the general data located between point A and point B. Accordingly, the calculated average value is outputted to the second FFT unit 304. The second FFT unit 304 converts the estimated CIR to the frequency domain CIR, which is then outputted to the MMSE coefficient calculator 305. The MMSE coefficient calculator 305 uses the average CIR of the frequency domain in order to calculate the equalization coefficient domain that can provide minimum mean square error (MMSE) and to output the calculated equalization coefficient to the distortion compensator 302. The operations of the components that follow are identical to those shown in FIG. 3, and so the description of the same will, therefore, be omitted for simplicity.

Figure 5:
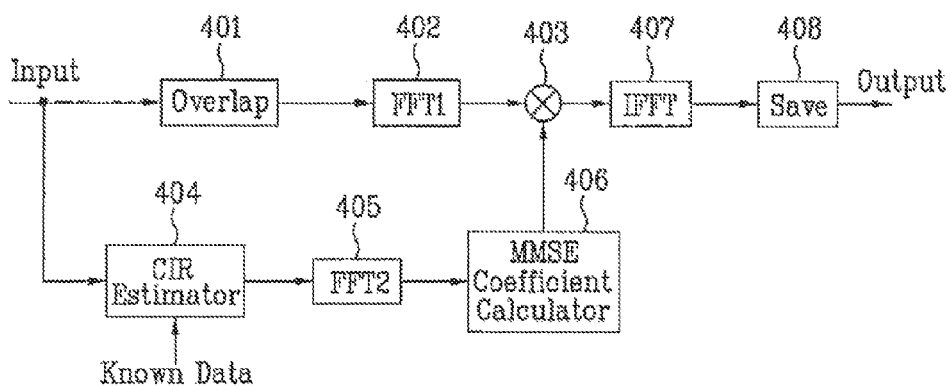
FIG. 5 illustrates a block diagram of a channel equalizer according to a third embodiment of the present invention.

FIG. 5 illustrates a block diagram of a channel equalizer according to a third embodiment of the present invention. More specifically, FIG. 5 illustrates a block diagram of a frequency domain channel equalizer using an indirect equalization method according to a third embodiment of the present invention. Herein, an overlap & save method is used to perform linear convolutional operation in the frequency domain. Referring to FIG. 5, the channel equalizer includes an overlap unit 401, a first fast fourier transform (FFT) unit 402, a distortion compensator 403, a channel estimator 404, a second FFT unit 405, a MMSE coefficient calculator 406, an inverse fast fourier transform (IFFT) unit 407, and a save unit 408. Herein, any device performed complex number multiplication may be used as the distortion compensator 403.

In the channel equalizer having the above-described structure, as shown in FIG. 5, the received data are overlapped by the overlap unit 401 and then inputted to the first FFT unit 402. The first FFT unit 402 converts (or transforms) the overlapped data of the time domain to overlapped data of the frequency domain by using fast fourier transform (FFT). Then, the converted data are outputted to the distortion compensator 403. The distortion compensator 403 performs complex multiplication on the equalization coefficient calculated from the MMSE coefficient calculator 405 and the overlapped data of the frequency domain, thereby compensating the channel distortion of the overlapped data being outputted from the first FFT unit 402. Thereafter, the distortion-compensated data are outputted to the IFFT unit 407. The IFFT unit 407 performs inverse fast fourier transform (IFFT) on the distortion-compensated overlapped data, so as to convert the corresponding data back to data (i.e., overlapped data) of the time domain. Thereafter, the converted data are outputted to the save unit 408. The save unit 40B extracts only the valid data from the overlapped data of the time domain, thereby outputting the extracted valid data.

Meanwhile, the channel estimator 404 estimates the CIR by using the data received during the known data section and the known data of the known data section, the known data being already known by the receiving system in accordance with an agreement between the receiving system and the transmitting system. Then, the estimated CIR is outputted to the second FFT unit 405. The second FFT unit 405 performs FFT on the estimated CIR of the time domain in order to convert the time domain CIR to a frequency domain CIR. Then, the second FFT unit 405 outputs the converted CIR to the MMSE coefficient calculator 406.

The MMSE coefficient calculator 406 uses the estimated CIR of the frequency domain, so as to calculate the equalization coefficient and to output the calculated equalization coefficient to the distortion compensator 403. The MMSE coefficient calculator 406 is an exemplary part of the channel equalizer according to the first embodiment of the present invention. At this point, the MMSE coefficient calculator 406 calculates a channel equalization coefficient of the frequency domain that can provide minimum mean square error (MMSE) from the estimated CIR of the frequency domain. The calculated channel equalization coefficient is outputted to the distortion compensator 403. More specifically, the frequency domain channel equalizer of FIG. 3 performs circular convolution calculation in the frequency domain in order to perform the channel equalization process. On the other hand, the frequency domain channel equalizer of FIG. 5 performs linear convolution calculation in the frequency domain in order to perform the channel equalization process. Other than this, the remaining components and the corresponding operations are identical to one another and so, a detailed description of the same will, therefore, be omitted for simplicity.

Since the frequency domain channel equalizer of FIG. 5 does not use the characteristics of the guard interval, unlike in FIG. 3, the channel equalizer shown in FIG. 5 is advantageous in that there are no limitations when determining the FFT block section. More specifically, the known data do not necessarily have to be located in front of and behind the general data which are inputted to the first FFT unit FTT1. Herein, the channel equalizers are used to estimate the CIRs by using the known data that are periodically transmitted. Since the CIRs are used to calculate each equalization coefficient, the speed at which the equalization coefficient is updated largely depends the cycle period according to which the known data are being transmitted. Therefore, in a dynamic channel (i.e., in a channel wherein the characteristics change in accordance with the time), when the channel changing speed is faster than the transmission cycle of the known data, the equalization performance may be deteriorated. At this point, when the known data are frequently transmitted in order to compensate the channel that undergoes frequent and fast changes, the transmission efficiency of the general data, in which the actual valid contents are transmitted, may be deteriorated. Accordingly, there are limitations in reducing the transmission cycle of the known data.

Figure 6:
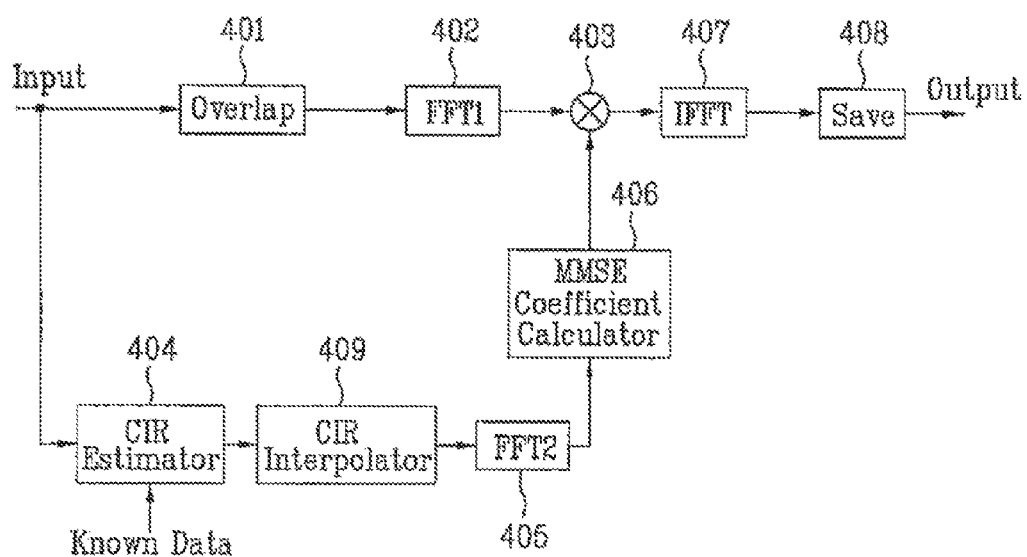
FIG. 6 illustrates a block diagram of a channel equalizer according to a fourth embodiment of the present invention.

In order to resolve such problems, another example of a channel equalizer is presented in FIG. 6. FIG. 6 illustrates a block diagram of a channel equalizer of the frequency domain according to a fourth embodiment of the present invention. Instead of frequently transmitting the known data, the channel equalizer according to the fourth embodiment of the present invention interpolates CIRs that are estimated in the known data section and uses the interpolated CIRs for the channel equalization of the general data. Herein, the channel equalizer of FIG. 6 further includes an interpolator 409 between the channel estimator 404 and the second FFT unit 405 of FIG. 5.

More specifically, the channel estimator 404 estimates the CIR by using the data received during the known data section and the known data. Then, the estimated CIR is outputted to the interpolator 403. Herein, the interpolator 409 uses the inputted CIR to estimate CIR of the section that does not include the known data by using a pre-determined interpolation method. Then, the interpolator 409 outputs the estimated CIR to the second FFT unit 405. The second FFT unit 405 converts the inputted CIR to the frequency domain CIR, which is then outputted to the MMSE coefficient calculator 406. The MMSE coefficient calculator 406 uses the interpolated CIR of the frequency domain in order to calculate the equalization coefficient domain that can provide minimum mean square error (MMSE) and to output the calculated equalization coefficient to the distortion compensator 403. The operations of the components that follow are identical to those shown in FIG. 5, and so the description of the same will, therefore, be omitted for simplicity.

Figure 7:
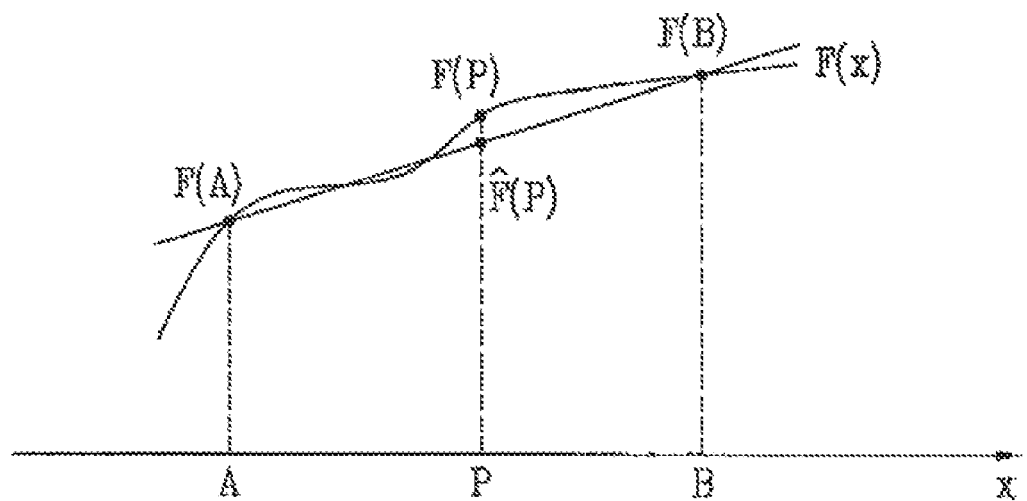
FIG. 7 illustrates an example of a linear interpolation of an interpolator shown in FIG. 6.

Herein, the interpolation method of the interpolator 409 corresponds to a method of estimating data of an unknown point by using the data known from a particular function. The simplest example of interpolation is the linear interpolation, which is illustrated in FIG. 7. More specifically, in a random function F(x), when given the values F(A) and F(B) each from points x=A and x=B, respectively, the estimated value $\hat{F}(P)$ of the F(x) function at point x=P may be estimated by using Equation 1 below.

$$\hat{F}(P) = \frac{F(B) - F(A)}{B - A}(P - A) + F(A)$$

$$\hat{F}(P) = \frac{B - P}{B - A}F(A) + \frac{P - A}{B - A}F(B)$$

Equation 1

If the known data sequence is periodically inserted and transmitted, the distance between the two known data sections positioned in front of and behind the general data section, according to the embodiment of the present invention, is determined as one cycle. Herein, the data section corresponding to one cycle is divided into a plurality of sections. The CIR is estimated in each divided section by using the above-described interpolation method. However, when one data cycle is divided into a plurality of sections, not all FFT block sections can be configured to have the known data located (or positioned) before or behind the FFT block section, as shown in FIG. 2. Therefore, the above-described interpolation method cannot be used in the frequency domain channel equalizer using the cyclic prefix. Nevertheless, when using the frequency channel equalizer using the overlap & save method, as shown in FIG. 6.

Figure 8:
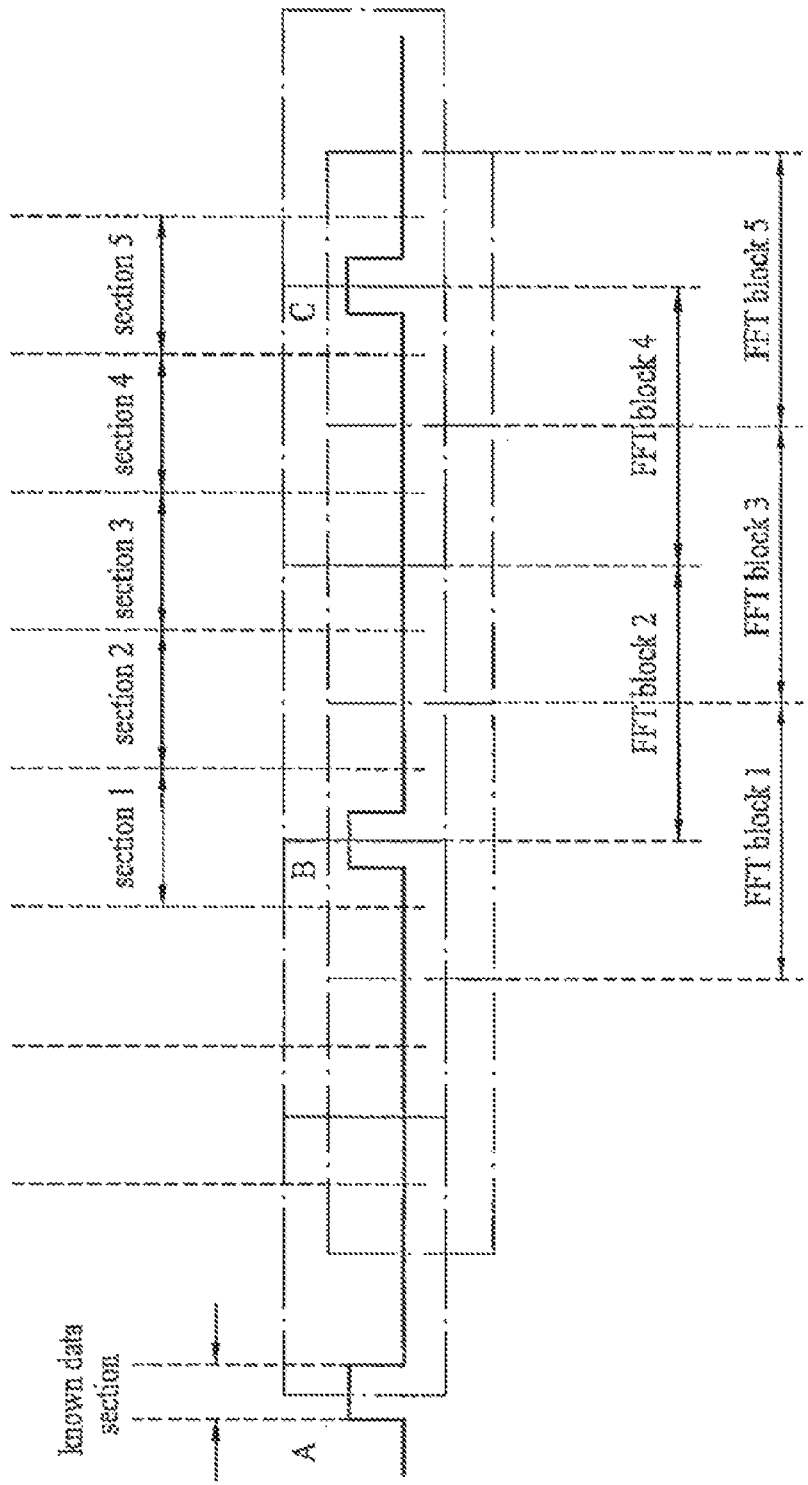
FIG. 8 and FIG. 9 illustrate examples of overlap & save processes according to an embodiment of the present invention.
Figure 9:
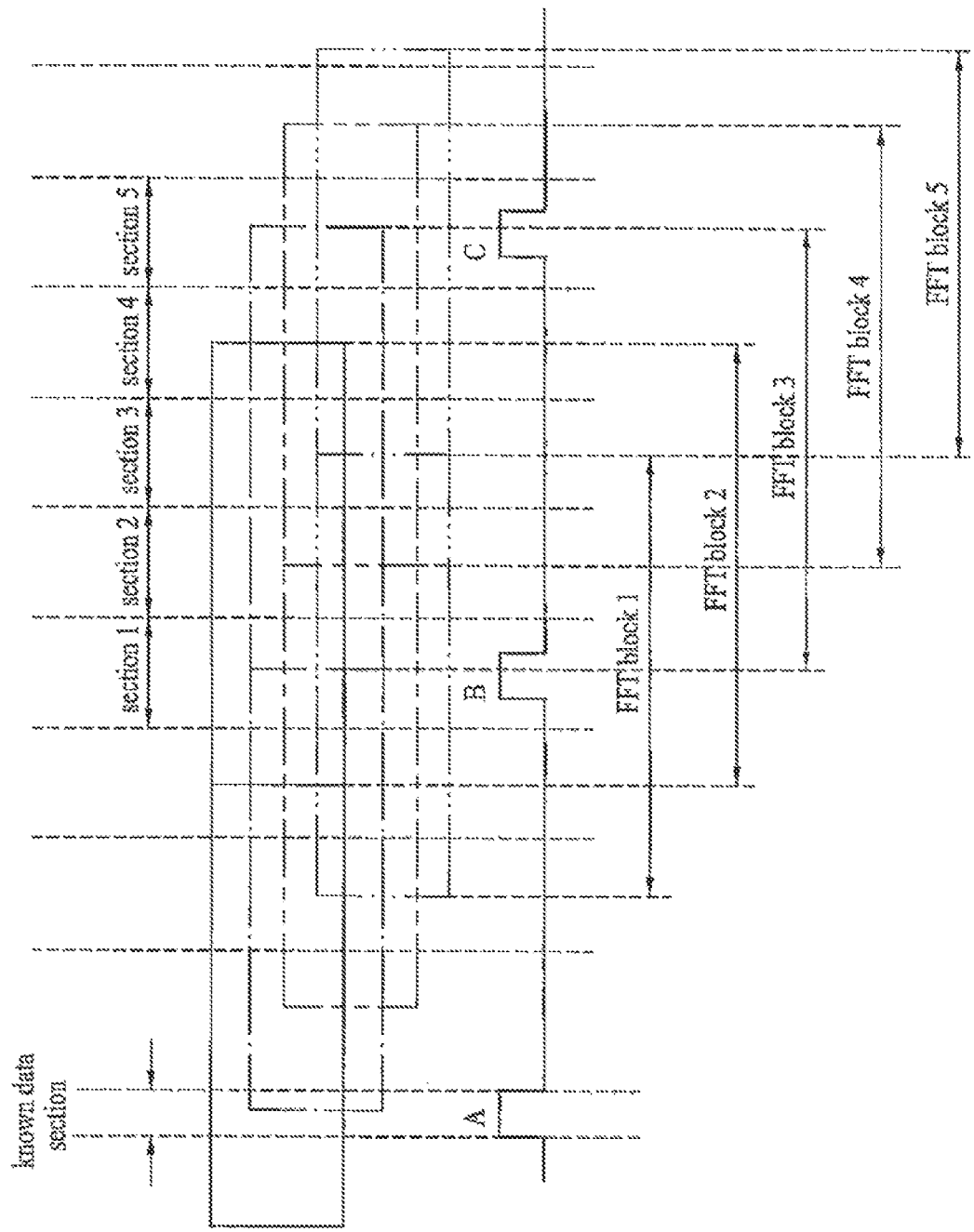

FIG. 8 and FIG. 9 illustrate examples of overlap & save processes according to an embodiment of the present invention, when linearly interpolating the CIR. Referring to FIG. 8, data are overlapped so that the current FFT block and the previous FFT block are overlapped at an overlapping ratio of 50%, and the data cycle positioned before and after the general data section is divided into 4 sections. In this example, the size and number of each section are decided so that a known data sequence is included in at least one section of the data cycle. This is to enable FFT block data of the section including the known data sequence directly to use the CIR estimated from the corresponding section for the channel equalization process. Furthermore, the CIR obtained (or calculated) from corresponding section is used for interpolating the CIR of the section that does not include any known data sequence.

Herein, the data inputted to the first FFT unit 402 are inserted in order from FFT block/to FFT block 5, as shown in FIG. 8. The inputted data are then inputted to the distortion compensator 403 so as to be equalized. Subsequently, the equalized data are converted to time domain data by the IFFT unit 407. Then, only the portion corresponding to valid data is extracted from the converted by the save unit 408. Thereafter, the final data are outputted.

Referring to FIG. 8, sections 1 to 5 represent the valid data section corresponding to each FFT block. At this point, since a known data sequence is included in the FFT block 1, the CIR B may be estimated. Similarly, since a known data sequence is included in the FFT block 5, the CIR C may also be estimated. In other words, the data of the FFT block 1 use the estimated CIR B to perform channel equalization, and the data of the FFT block 5 uses the estimated CIR C to perform channel equalization. However, since the known data sequence is not included in FFT block 2 to FFT block 4, the interpolator 409 interpolates CIR B and CIR C, thereby estimating the CIRs that may each be used in the FFT block 2 to the FFT block 4. At this point, if linear interpolation is used, the CIRs corresponding to FFT block 2 to FFT block 4 may be estimated by using Equation 2 shown below.

FFT Block 2: 0.75B+0.25C

FFT Block 3: 0.5B+0.5C

FFT Block 4: 0.25B+0.75C  Equation 2

Referring to FIG. 9, data are overlapped so that the current FFT block and the previous FFT block are overlapped at an overlapping ratio of 75%, and the data cycle positioned before and after the general data section is divided into 4 sections. Similarly, in this example, the size and number of each section are decided so that a known data sequence is included in at least one section of the data cycle. Furthermore, the interpolated and estimated CIRs are identical as those shown in FIG. 8. Yet, the only difference is that the FFT block size is twice the size of the FFT blocks of FIG. 8. As described above, the examples shown in FIG. 8 and FIG. 9 are merely exemplary, and the degree and algorithm of the interpolation method and the size of the FFT block may be set diversely whenever required or necessary.

Meanwhile, as shown in FIG. 1, a sufficiently long set of known data is periodically transmitted in the body area. Therefore, an indirect equalization method using the CIR may be adopted in the body area. However, a sufficiently long set of known data can neither be transmitted by its long size nor be transmitted periodically or constantly in the head/tail areas. Therefore, it is not adequate to estimate the CIR by using the known data in the head/tail areas. Accordingly, a direct equalization method calculating (or obtaining) error from the output of the equalizer, thereby updating the coefficient is used in the head/tail areas.

Figure 10:
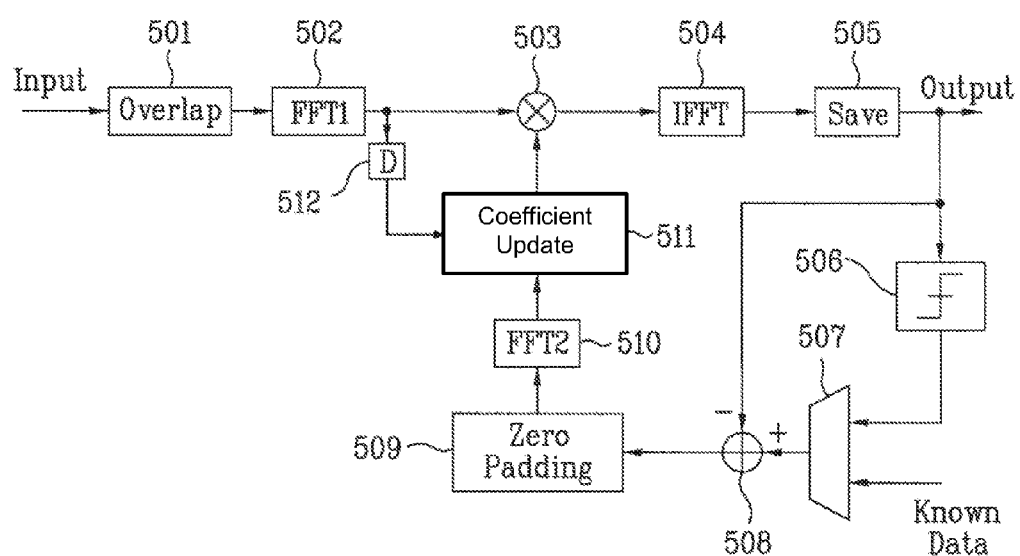
FIG. 10 illustrates a block diagram of a channel equalizer according to a fifth embodiment of the present invention.

FIG. 10 illustrates a block diagram of a channel equalizer according to a fifth embodiment of the present invention. More specifically, FIG. 10 illustrates a block diagram showing the structure of a channel equalizer of a frequency domain using a direct equalization method according to the present invention. Referring to FIG. 10, the channel equalizer includes an overlap unit 501, a first fast fourier transform (FFT) unit 502, a distortion compensator 503, an inverse fast fourier transform (IFFT) unit 504, a save unit 505, a decision unit 506, a select unit 507, a subtractor 508, a zero padding unit 509, a second FFT unit 510, a coefficient update unit 511, and a delay unit 512. Herein, any device that performs complex number multiplication may be used as the distortion compensator 503.

In the channel equalizer having the above-described structure, as shown in FIG. 10, the received data are overlapped by the overlap unit 501 and are outputted to the first FFT unit 502. The first FFT unit 502 performs a FFT process to convert the overlapped data of the time domain to overlapped data of the frequency domain. Then, the converted overlapped data are outputted to distortion compensator 503 and delay unit 512. The distortion compensator 503 performs complex multiplication on overlapped data of the frequency domain and the equalization coefficient of the frequency domain updated by the coefficient update unit 511, thereby compensating the channel distortion of the overlapped data being outputted from the first FFT unit 502. Thereafter, the distortion-compensated data are outputted to the IFFT unit 504. The IFFT unit 504 performs inverse fast fourier transform (IFFT) on the distortion-compensated overlapped data, so as to convert the corresponding data back to data (i.e., overlapped data) of the time domain. Then, the converted data are outputted to the save unit 505. The save unit 505 extracts only the valid data from the overlapped data of the time domain, thereby outputting the extracted valid data for data decoding. Simultaneously, the extracted valid data are outputted to the decision unit 506 and the subtractor 508 for updating the equalization coefficient.

The decision unit 506 selects one of a plurality of decision values (e.g., 8 decision values) that is most approximate to the equalized data and outputs the selected decision value to the select unit 507. Herein, a multiplexer may be used as the select unit 507. In a general data section, the select unit 507 selects the decision value of the decision unit 506. Alternatively, in a known data section, the select unit 507 selects the known data and outputs the selected known data to the subtractor 508. The subtractor 508 subtracts the output of the save unit 505 from the output of the select unit 507 so as to calculate (or obtain) an error value. Thereafter, the calculated error value is outputted to the zero padding unit 509.

The zero padding unit 509 adds (or inserts) the same amount of zeros (0) corresponding to the overlapped amount of the received data in the inputted error. Then, the error extended with zeros (0) is outputted to the second FFT unit 510. The second FFT unit 510 converts the error of the time domain having zeros (0) added (or inserted) therein, to the error of the frequency domain. Thereafter, the converted error is outputted to the coefficient update unit 511. The coefficient update unit 511 uses the received data of the frequency domain that have been delayed by the delay unit 512 and the error of the frequency domain so as to update the previous equalization coefficient. Thereafter, the updated equalization coefficient is outputted to the distortion compensator 503. At this point, the updated equalization coefficient is stored so as that it can be used as a previous equalization coefficient in a later process. In the digital broadcast transmitting system, shown in FIG. 1, data corresponding to the body area and the head/tail areas may all be transmitted. Therefore, in order to enhance the equalization efficiency, it is preferable to use an adequate equalizer for each corresponding area.

Figure 11:
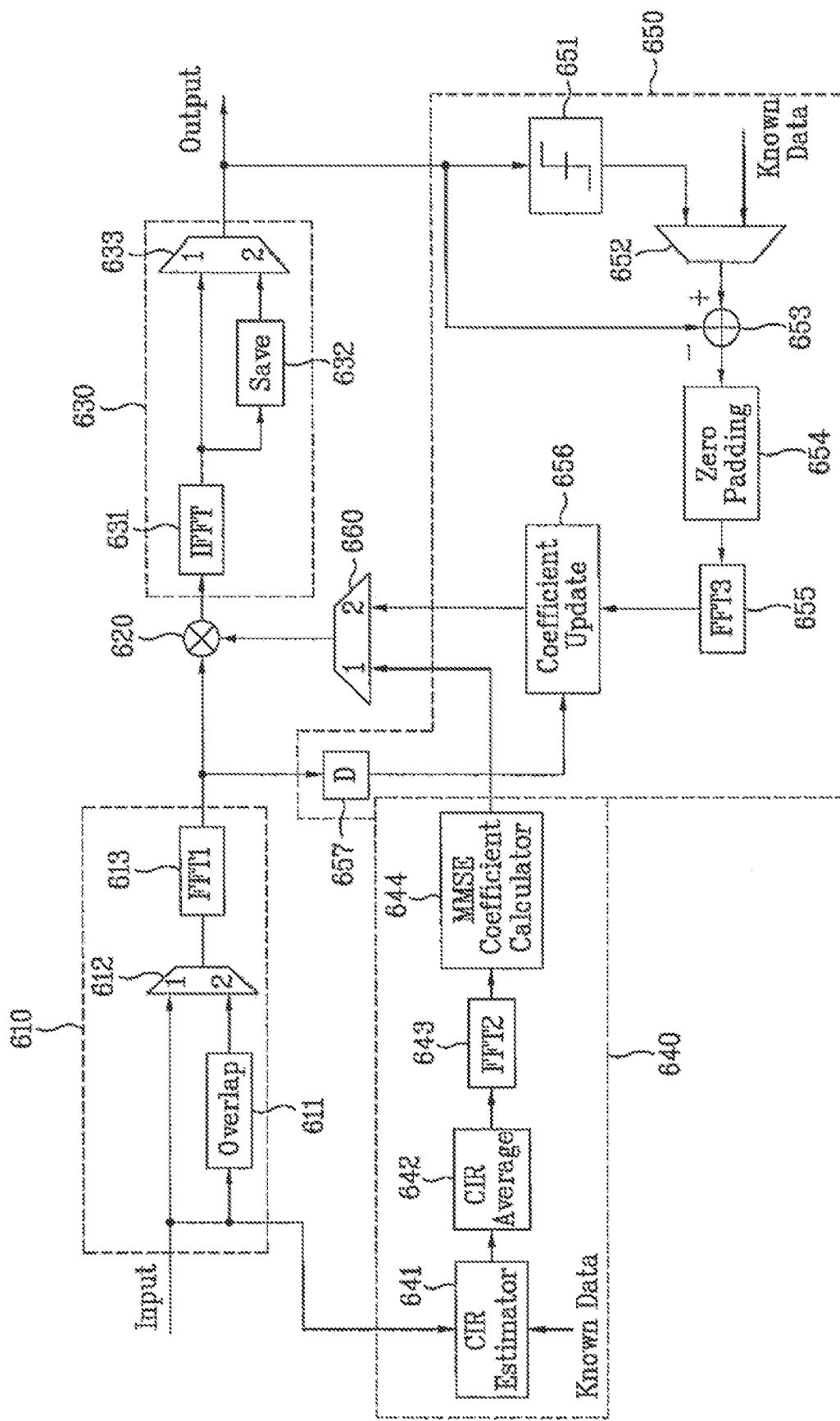
FIG. 11 illustrates a block diagram of a channel equalizer according to a sixth embodiment of the present invention.

The present invention also proposes a hybrid equalization method of the channel equalizer using both direct and indirect equalization methods. FIG. 11 illustrates a block diagram of a channel equalizer according to a sixth embodiment of the present invention. In other words, FIG. 11 illustrates a block diagram showing the structure of a channel equalizer of a frequency domain by using a hybrid method according to the present invention. The examples presented in the sixth embodiment of the present invention includes a method of performing indirect channel equalization by using a cyclic prefix on the data of the body area, and a method of performing direct channel equalization by using an overlap & save method on the data of the head/tail areas.

Accordingly, referring to FIG. 11, the frequency domain channel equalizer includes a frequency domain converter 610, a distortion compensator 620, a time domain converter 630, a first coefficient calculating unit 640, a second coefficient calculating unit 650, and a coefficient selector 660. Herein, the frequency domain converter 610 includes an overlap unit 611, a select unit 612, and a first FFT unit 613. The time domain converter 630 includes an IFFT unit 631, a save unit 632, and a select unit 633. The first coefficient calculating unit 640 includes a channel estimator 641, an average calculator 642, and second FFT unit 643, and a MMSE coefficient calculator 644. The second coefficient calculating unit 650 includes a decision unit 651, a select unit 652, a subtractor 653, a zero padding unit 654, a third FFT unit 655, a coefficient updater 656, and a delay unit 657. Also, a multiplexer (MUX), which selects data that are currently being inputted as the input data depending upon whether the data correspond to the body area or to the head/tail areas, may be used as the select unit 612 of the frequency domain converter 610, the select unit 633 of the time domain converter 630, and the coefficient selector 660.

In the channel equalizer having the above-described structure, as shown in FIG. 11, if the data being inputted correspond to the data of the body area, the select unit 612 of the frequency domain converter 610 selects the input data and not the output data of the overlap unit 611. In the same case, the select unit 633 of the time domain converter 630 selects the output data of the IFFT unit 631 and not the output data of the save unit 632. The coefficient selector 660 selects the equalization coefficient being outputted from the first coefficient calculating unit 640. Conversely, if the data being inputted correspond to the data of the body area, the select unit 612 of the frequency domain converter 610 selects the output data of the overlap unit 611 and not the input data. In the same case, the select unit 633 of the time domain converter 630 selects the output data of the save unit 632 and not the output data of the IFFT unit 631. The coefficient selector 660 selects the equalization coefficient being outputted from the second coefficient calculating unit 650.

More specifically, the received data are inputted to the overlap unit 611 and select unit 612 of the frequency domain converter 610, and to the first coefficient calculating unit 640. If the inputted data correspond to the data of the body area, the select unit 612 selects the received data, which are then outputted to the first FFT unit 613. On the other hand, if the inputted data correspond to the data of the head/tail areas, the select unit 612 selects the data that are overlapped by the overlap unit 613 and are, then, outputted to the first FFT unit 613. The first FFT unit 613 performs FFT on the time domain data that are outputted from the select unit 612, thereby converting the time domain data to frequency domain data. Then, the converted data are outputted to the distortion compensator 620 and the delay unit 657 of the second coefficient calculating unit 650.

The distortion compensator 620 performs complex multiplication on frequency domain data outputted from the first FFT unit 613 and the equalization coefficient outputted from the coefficient selector 660, thereby compensating the channel distortion detected in the data that are being outputted from the first FFT unit 613. Thereafter, the distortion-compensated data are outputted to the IFFT unit 631 of the time domain converter 630. The IFFT unit 631 of the time domain converter 630 performs IFFT on the channel-distortion-compensated data, thereby converting the compensated data to time domain data. The converted data are then outputted to the save unit 632 and the select unit 633. If the inputted data correspond to the data of the body area, the select unit 633 selects the output data of the IFFT unit 631. On the other hand, if the inputted data correspond to the head/tail areas, the select unit 633 selects the valid data extracted from the save unit 632. Thereafter, the selected data are outputted to be decoded and, simultaneously, outputted to the second coefficient calculating unit 650.

The channel estimator 641 of the first coefficient calculating unit 640 uses the data being received during the known data section and the known data of the known data section, the known data being already known by the receiving system in accordance with an agreement between the receiving system and the transmitting system, in order to estimate the CIR. Subsequently, the estimated CIR is outputted to the average calculator 642. The average calculator 642 calculates an average value of the CIRs that are being inputted consecutively. Then, the calculated average value is outputted to the second FFT unit 643. For example, referring to FIG. 2, the average value of the CIR value estimated at point A and the CIR value estimated at point B is used for the channel equalization process of the general data existing between point A and point B. Accordingly, the calculated average value is outputted to the second FFT unit 643.

The second FFT unit 643 performs FFT on the CIR of the time domain that is being inputted, so as to convert the inputted CIR to a frequency domain CIR. Thereafter, the converted frequency domain CIR is outputted to the MMSE coefficient calculator 644. The MMSE coefficient calculator 644 calculates a frequency domain equalization coefficient that satisfies the condition of using the CIR of the frequency domain so as to minimize the mean square error. The calculated equalizer coefficient of the frequency domain is then outputted to the coefficient calculator 660.

The decision unit 651 of the second coefficient calculating unit 650 selects one of a plurality of decision values (e.g., 8 decision values) that is most approximate to the equalized data and outputs the selected decision value to the select unit 652. Herein, a multiplexer may be used as the select unit 652. In a general data section, the select unit 652 selects the decision value of the decision unit 651. Alternatively, in a known data section, the select unit 652 selects the known data and outputs the selected known data to the subtractor 653. The subtractor 653 subtracts the output of the select unit 633 included in the time domain convertor 630 from the output of the select unit 652 so as to calculate (or obtain) an error value. Thereafter, the calculated error value is outputted to the zero padding unit 654.

The zero padding unit 654 adds (or inserts) the same amount of zeros (0) corresponding to the overlapped amount of the received data in the inputted error. Then, the error extended with zeros (0) is outputted to the third FFT unit 655. The third FFT unit 655 converts the error of the time domain having zeros (0) added (or inserted) therein, to the error of the frequency domain. Thereafter, the converted error is outputted to the coefficient update unit 656. The coefficient update unit 656 uses the received data of the frequency domain that have been delayed by the delay unit 657 and the error of the frequency domain so as to update the previous equalization coefficient. Thereafter, the updated equalization coefficient is outputted to the distortion compensator 503. At this point, the updated equalization coefficient is stored so as that it can be used as a previous equalization coefficient in a later process. If the input data correspond to the data of the body area, the coefficient selector 660 selects the equalization coefficient calculated from the first coefficient calculating unit 640. On the other hand, if the input data correspond to the data of the head/tail areas, the coefficient selector 660 selects the equalization coefficient updated by the second coefficient calculating unit 650. Thereafter, the selected equalization coefficient is outputted to the distortion compensator 620.

Figure 12:
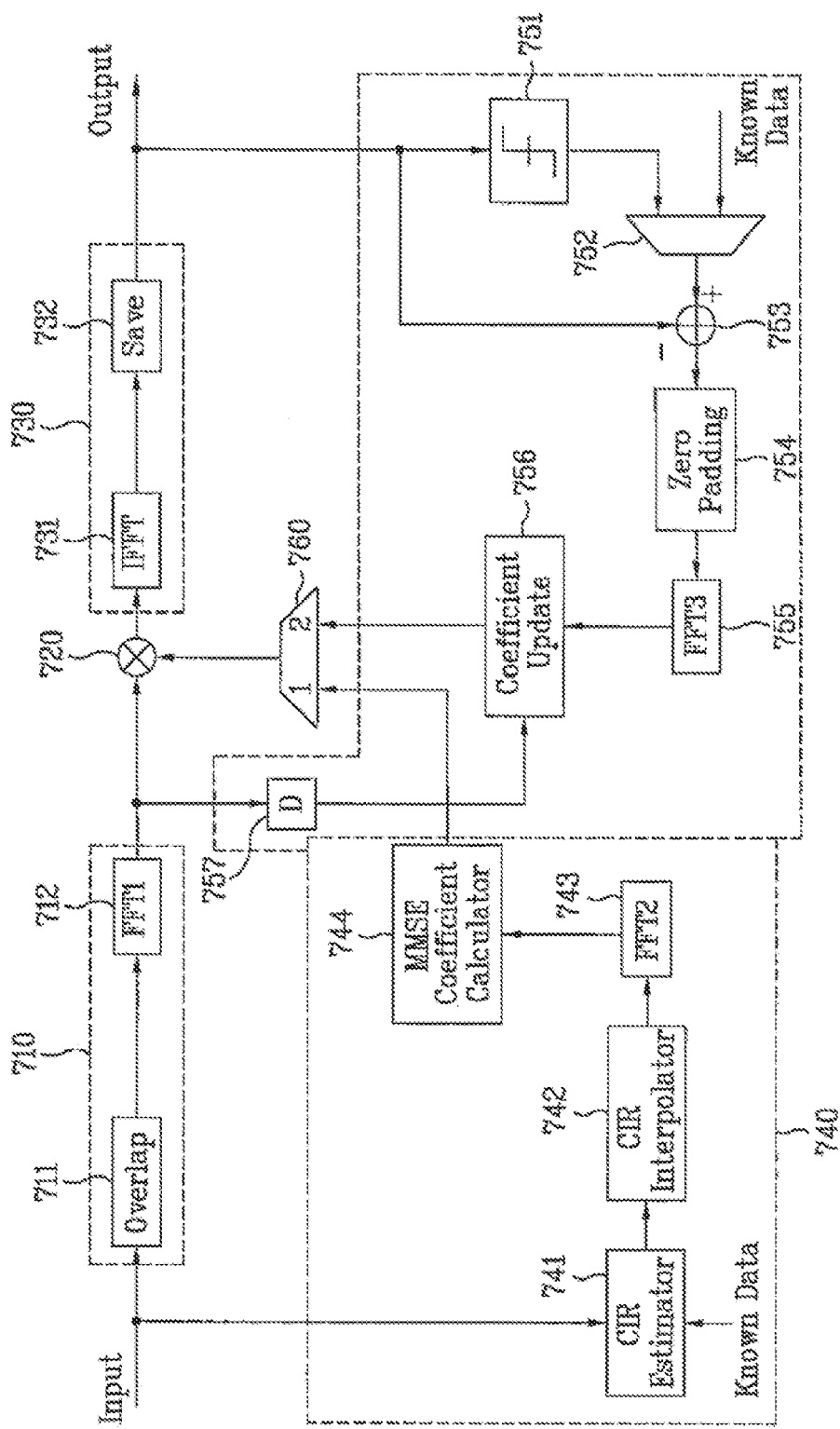
FIG. 12 illustrates a block diagram of a channel equalizer according to a seventh embodiment of the present invention.

FIG. 12 illustrates a block diagram of a channel equalizer according to a seventh embodiment of the present invention. In other words, FIG. 12 illustrates a block diagram showing another example of a channel equalizer of a frequency domain by using a hybrid method according to the present invention. In this example, a method of performing indirect channel equalization by using an overlap & save method on the data of the body area, and a method of performing direct channel equalization by using an overlap & save method on the data of the head/tail areas are illustrated.

Accordingly, referring to FIG. 12, the frequency domain channel equalizer includes a frequency domain converter 710, a distortion compensator 720, a time domain converter 730, a first coefficient calculating unit 740, a second coefficient calculating unit 750, and a coefficient selector 760. Herein, the frequency domain converter 710 includes an overlap unit 711 and a first FFT unit 712. The time domain converter 730 includes an IFFT unit 731 and a save unit 732. The first coefficient calculating unit 740 includes a channel estimator 741, an interpolator 742, a second FFT unit 743, and a MMSE coefficient calculator 744. The second coefficient calculating unit 750 includes a decision unit 751, a select unit 752, a subtractor 753, a zero padding unit 754, a third FFT unit 755, a coefficient updater 756, and a delay unit 757. Also, a multiplexer (MUX), which selects data that are currently being inputted as the input data depending upon whether the data correspond to the body area or to the head/tail areas, may be used as the coefficient selector 760. More specifically, if the input data correspond to the data of the body area, the coefficient selector 760 selects the equalization coefficient calculated from the first coefficient calculating unit 740. On the other hand, if the input data correspond to the data of the head/tail areas, the coefficient selector 760 selects the equalization coefficient updated by the second coefficient calculating unit 750.

In the channel equalizer having the above-described structure, as shown in FIG. 12, the received data are inputted to the overlap unit 711 of the frequency domain converter 710 and to the first coefficient calculating unit 740. The overlap unit 711 overlaps the input data to a pre-determined overlapping ratio and outputs the overlapped data to the first FFT unit 712. The first FFT unit 712 performs FFT on the overlapped time domain data, thereby converting the overlapped time domain data to overlapped frequency domain data. Then, the converted data are outputted to the distortion compensator 720 and the delay unit 757 of the second coefficient calculating unit 750.

The distortion compensator 720 performs complex multiplication on the overlapped frequency domain data outputted from the first FFT unit 712 and the equalization coefficient outputted from the coefficient selector 760, thereby compensating the channel distortion detected in the overlapped data that are being outputted from the first FFT unit 712. Thereafter, the distortion-compensated data are outputted to the IFFT unit 731 of the time domain converter 730. The IFFT unit 731 of the time domain converter 730 performs IFFT on the distortion-compensated data, thereby converting the compensated data to overlapped time domain data. The converted overlapped data are then outputted to the save unit 732. The save unit 732 extracts only the valid data from the overlapped time domain data, which are then outputted for data decoding and, at the same time, outputted to the second coefficient calculating unit 750 in order to update the coefficient.

The channel estimator 741 of the first coefficient calculating unit 740 uses the data received during the known data section and the known data in order to estimate the CIR. Subsequently, the estimated CIR is outputted to the interpolator 742. The interpolator 742 uses the inputted CIR to estimate the CIRs (i.e., CIRs of the area that does not include the known data) corresponding to the points located between the estimated CIRs according to a predetermined interpolation method. Thereafter, the estimated result is outputted to the second FFT unit 743. The second FFT unit 743 performs FFT on the inputted CIR, so as to convert the inputted CIR to a frequency domain CIR. Thereafter, the converted frequency domain CIR is outputted to the MMSE coefficient calculator 744. The MMSE coefficient calculator 744 calculates a frequency domain equalization coefficient that satisfies the condition of using the CIR of the frequency domain so as to minimize the mean square error. The calculated equalizer coefficient of the frequency domain is then outputted to the coefficient calculator 760.

The structure and operations of the second coefficient calculating unit 750 is identical to those of the second coefficient calculating unit 650 shown in FIG. 11. Therefore, the description of the same will be omitted for simplicity. If the input data correspond to the data of the body area, the coefficient selector 760 selects the equalization coefficient calculated from the first coefficient calculating unit 740. On the other hand, if the input data correspond to the data of the head/tail areas, the coefficient selector 760 selects the equalization coefficient updated by the second coefficient calculating unit 750. Thereafter, the selected equalization coefficient is outputted to the distortion compensator 720.

Figure 13:
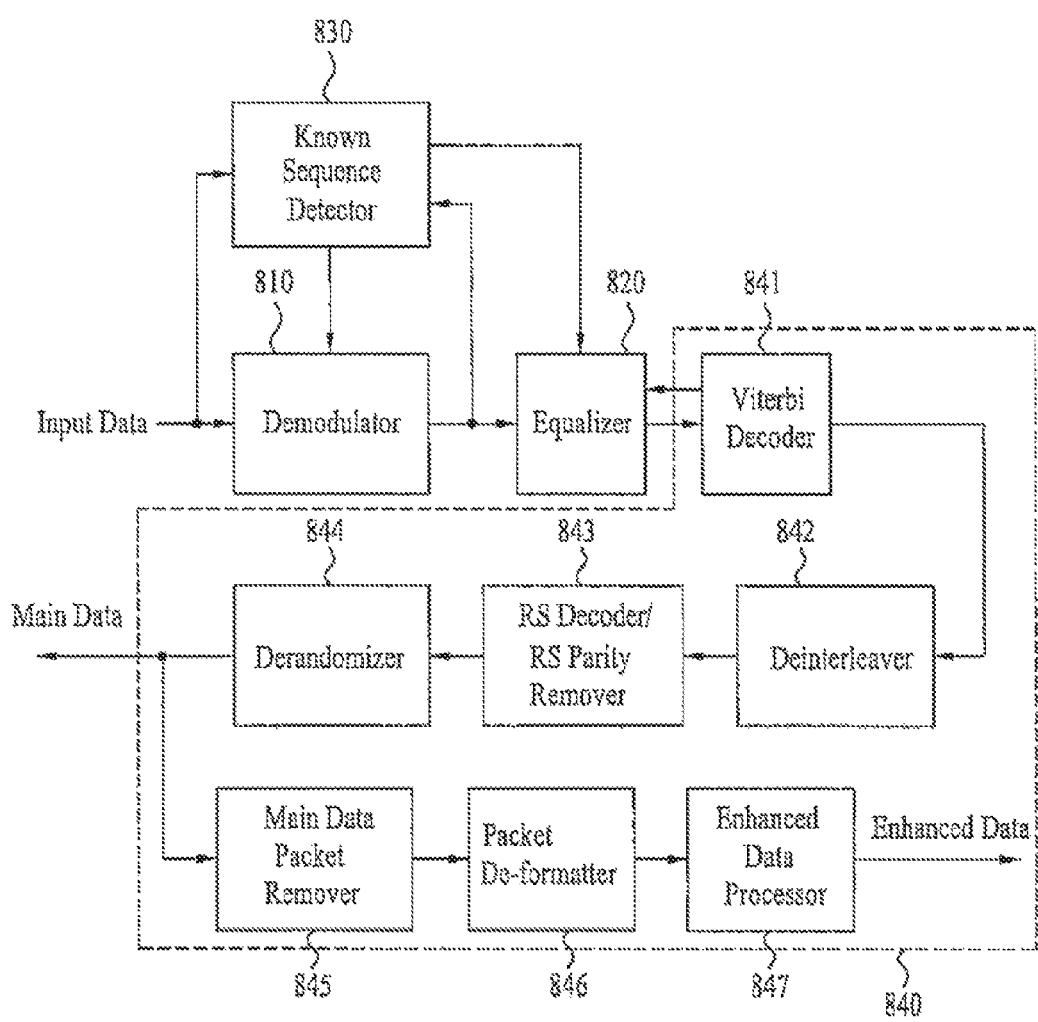
FIG. 13 illustrates a block diagram showing the structure of a demodulating unit included a digital broadcast receiving system according to an embodiment of the present invention.

FIG. 13 illustrates an example of a demodulating unit within a digital broadcast receiving system having at least one of the above-described channel equalizers adopted therein. The demodulating unit shown in FIG. 13 is merely an example given to simplify the understanding of the present invention. Any demodulating unit that can adopt the above-described channel equalization method may be used in the present invention. Therefore, the embodiments of the present invention are not limited to the examples set forth herein.

Referring to FIG. 13, the demodulating unit includes a demodulator 810, a channel equalizer 820, a known sequence detector 830, and an error correction unit 840. Herein, the error correction unit 840 includes a Viterbi decoder 841, a data deinterleaver 842, a RS decoder/non-systematic RS parity remover 843, a derandomizer 844, a main data packet remover 845, a packet deformatter 846, and an enhanced data processor 847. More specifically, a frequency that is received through a particular channel provides to the demodulator 810 and the known sequence detector 830. The demodulator 810 uses the known data on the channel frequency so as to perform carrier recovery and timing recovery, thereby create baseband signals. Thereafter, the baseband signals are outputted to the channel equalizer 820 and the known sequence detector 830.

The channel equalizer 820 uses any one of the channel equalizers shown in FIG. 3 to FIG. 6 and in FIG. 10 to FIG. 12, so as to estimate the CIR. Then, the channel equalizer 820 uses the estimated CIR to compensate for the distortion occurring in the channel including the demodulated signals. Thereafter, the distortion-compensated data are outputted to the error correction unit 840. The known sequence detector 830 detects the known data, which have been inserted from the transmitting system, from the input/output data of the demodulator 810 (i.e., the data prior to demodulation or the data after demodulation). Thereafter, the detected known data are outputted to the demodulator 810 and the channel equalizer 820. The Viterbi decoder 841 of the error correction unit 840 Viterbi-decodes the data that are outputted from the channel equalizer 820. At this point, the 8-level decision values decided by the Viterbi decoder 841 are provided to the channel equalizer 820, thereby enhancing the equalizing performance. The data deinterleaver 842 performs an inverse process of the data interleaver included in the transmitting system on the input data. Thereafter, the data deinterleaver 842 outputs the deinterleaved data to the RS decoder/non-systematic RS parity remover 843. If the received data packet corresponds to the main data packet, the RS decoder/non-systematic RS parity remover 843 performs a systematic RS decoding process. Alternatively, if the received data packet corresponds to the enhanced data packet, the RS decoder/non-systematic RS parity remover 843 removes the non-systematic RS parity byte that has been inserted in the enhanced data packet. Thereafter, the RS decoder/non-systematic RS parity remover 843 outputs the processed data to the derandomizer 844.

The derandomizer 844 performs a derandomizing process on the output of the RS decoder/non-systematic RS parity remover 843. Afterwards, the derandomizer 844 inserts a MPEG synchronization byte at the beginning of each packet so as to output the processed data in 188-byte packet units. The output of the derandomizer 844 is outputted to the main MPEG decoder (not shown) and to the main data packet remover 845 at the same time. Meanwhile, the main data packet remover 845 removes a 188-byte unit main data packet from the output of the derandomizer 844 and outputs the processed data to the packet deformatter 846. The packet deformatter 846 removes the MPEG header, which was inserted to the enhanced data packet by the transmitting system, and the known data from the enhanced data packet outputted from the main data packet remover 845. The processed enhanced data packet is then outputted to the enhanced data processor 847. The enhanced data processor 847 performs null data removing, additional error correction coding, and deinterleaving processes on the output of the packet deformatter 846. Thus, the finally processed enhanced data are outputted.

Figure 14:
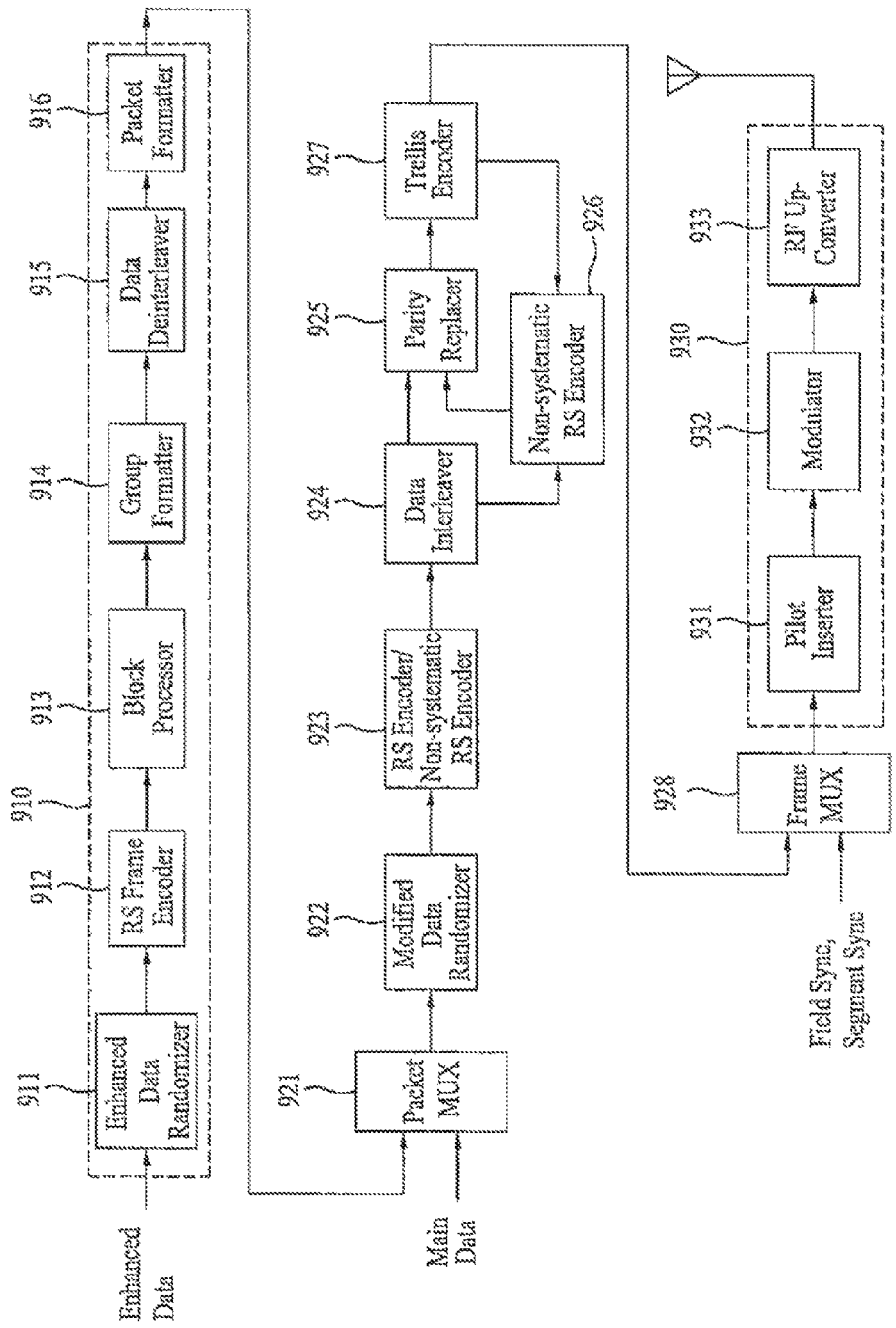
FIG. 14 illustrates a block diagram of a digital broadcast (or television or DTV) transmitting system according to another embodiment of the present invention.

FIG. 14 illustrates a block diagram showing the structure of a digital broadcast transmitting system according to an embodiment of the present invention. The digital broadcast (or DTV) transmitting system includes a pre-processor 910, a packet multiplexer 921, a data randomizer 922, a Reed-Solomon (RS) encoder/non-systematic RS encoder 923, a data interleaver 924, a parity byte replacer 925, a non-systematic RS encoder 926, a frame multiplexer 928, and a transmitting system 930. The pre-processor 910 includes an enhanced data randomizer 911, a RS frame encoder 912, a block processor 913, a group formatter 914, a data deinterleaver 915, and a packet formatter 916.

In the present invention having the above-described structure, main data are inputted to the packet multiplexer 921. Enhanced data are inputted to the enhanced data randomizer 911 of the pre-processor 910, wherein an additional coding process is performed so that the present invention can respond swiftly and appropriately against noise and change in channel. The enhanced data randomizer 911 randomizes the received enhanced data and outputs the randomized enhanced data to the RS frame encoder 912. At this point, by having the enhanced data randomizer 911 perform the randomizing process on the enhanced data, the randomizing process on the enhanced data by the data randomizer 922 in a later process may be omitted. Either the randomizer of the conventional broadcast system may be used as the randomizer for randomizing the enhanced data, or any other type of randomizer may be used herein.

The RS frame encoder 912 receives the randomized enhanced data and performs at least one of an error correction coding process and an error detection coding process on the received data. Accordingly, by providing robustness to the enhanced data, the data can scatter group error that may occur due to a change in the frequency environment. Thus, the data can respond appropriately to the frequency environment which is very poor and liable to change. The RS frame multiplexer 912 also includes a process of mixing in row units many sets of enhanced data each having a pre-determined size. By performing an error correction coding process on the inputted enhanced data, the RS frame encoder 912 adds data required for the error correction and, then, performs an error detection coding process, thereby adding data required for the error detection process. The error correction coding uses the RS coding method, and the error detection coding uses the cyclic redundancy check (CRC) coding method. When performing the RS coding process, parity data required for the error correction are generated. And, when performing the CRC coding process, CRC data required for the error detection are generated.

The RS frame encoder 912 performs CRC coding on the RS coded enhanced data in order to create the CRC code. The CRC code that is generated by the CRC coding process may be used to indicate whether the enhanced data have been damaged by an error while being transmitted through the channel. The present invention may adopt other types of error detection coding methods, apart from the CRC coding method, and may also use the error correction coding method so as to enhance the overall error correction ability of the receiving system. For example, assuming that the size of one RS frame is 187*N bytes, that (235,187)-RS coding process is performed on each column within the RS frame, and that a CRC coding process using a 2-byte (i.e., 16-bit) CRC checksum, then a RS frame having the size of 187*N bytes is expanded to a RS frame of 235*(N+2) bytes. The RS frame expanded by the RS frame encoder 912 is inputted to the block processor 913. The block processor 913 codes the RS-coded and CRC-coded enhanced data at a coding rate of G/H. Then, the block processor 913 outputs the G/H-rate coded enhanced data to the group formatter 914. In order to do so, the block processor 913 identifies the block data bytes being inputted from the RS frame encoder 912 as bits.

The block processor 913 may receive supplemental information data such as signaling information, which include information on the system, and identifies the supplemental information data bytes as data bits. Herein, the supplemental information data, such as the signaling information, may equally pass through the enhanced data randomizer 911 and the RS frame encoder 912 so as to be inputted to the block processor 913. Alternatively, the supplemental information data may be directly inputted to the block processor 913 without passing through the enhanced data randomizer 911 and the RS frame encoder 912. The signaling information corresponds to information required for receiving and processing data included in the data group in the receiving system. Such signaling information includes data group information, multiplexing information, and burst information.

As a G/H-rate encoder, the block processor 913 codes the inputted data at a coding rate of G/H and then outputs the G/H-rate coded data. For example, if 1 bit of the input data is coded to 2 bits and outputted, then G is equal to 1 and H is equal to 2 (i.e., G=1 and H=2). Alternatively, if 1 bit of the input data is coded to 4 bits and outputted, then G is equal to 1 and H is equal to 4 (i.e., G=1 and H=4). As an example of the present invention, it is assumed that the block processor 913 performs a coding process at a coding rate of 1/2 (also referred to as a 1/2-rate coding process) or a coding process at a coding rate of 1/4 (also referred to as a 1/4-rate coding process). More specifically, the block processor 913 codes the received enhanced data and supplemental information data, such as the signaling information, at either a coding rate of 1/2 or a coding rate of 1/4. Thereafter, the supplemental information data, such as the signaling information, are identified and processed as enhanced data.

Since the 1/4-rate coding process has a higher coding rate than the 1/2-rate coding process, greater error correction ability may be provided. Therefore, in a later process, by allocating the 1/4-rate coded data in an area with deficient receiving performance within the group formatter 914, and by allocating the 1/2-rate coded data in an area with excellent receiving performance, the difference in the overall performance may be reduced. More specifically, in case of performing the 1/2-rate coding process, the block processor 913 receives 1 bit and codes the received 1 bit to 2 bits (i.e., 1 symbol). Then, the block processor 913 outputs the processed 2 bits (or 1 symbol). On the other hand, in case of performing the 1/4-rate coding process, the block processor 913 receives 1 bit and codes the received 1 bit to 4 bits (i.e., 2 symbols). Then, the block processor 913 outputs the processed 4 bits (or 2 symbols). Additionally, the block processor 913 performs a block interleaving process in symbol units on the symbol-coded data. Subsequently, the block processor 913 converts to bytes the data symbols that are block-interleaved and have the order rearranged.

The group formatter 914 inserts the enhanced data outputted from the block processor 913 (herein, the enhanced data may include supplemental information data such as signaling information including transmission information) in a corresponding area within the data group, which is configured according to a pre-defined rule. Furthermore, in relation with the data deinterleaving process, various types of places holders or known data are also inserted in corresponding areas within the data group. At this point, the data group may be described by at least one hierarchical area. Herein, the data allocated to the each area may vary depending upon the characteristic of each hierarchical area. Additionally, each group is configured to include a field synchronization signal.

The present invention shows an example of the data group being divided into three hierarchical areas: a head area, a body area, and a tail area. Accordingly, in the data group that is inputted for the data deinterleaving process, data are first inputted to the head area, then inputted to the body area, and inputted finally to the tail area. In the example of the present invention, the head, body, and tail areas are configured so that the body area is not mixed with the main data area within the data group. Furthermore, in the present invention, the head, body, and tail areas may each be divided into lower hierarchical areas. For example, the head area may be divided into 3 lower hierarchical areas: a far head (FH) area, a middle head (MH) area, and a near head (NH) area. The body area may be divided into 4 lower hierarchical areas: a first lower body (B1) area, a second lower body (B2) area, a third lower body (B3) area, and a fourth lower body (B4) area. And, finally, the tail area may be divided into 2 lower hierarchical areas: a far tail (FT) area and a near tail (NT) area.

In the example of the present invention, the group formatter 914 inserts the enhanced data being outputted from the block processor 913 to the middle head (MH) area, the near head (NH) area, the first to fourth lower body (B1 to B4) areas, and the near tail (NT) area. Herein, the type of enhanced data may vary depending upon the characteristic of each area. The data group is divided into a plurality of areas so that each area may be used for different purposes. More specifically, areas having less interference with the main data may show more enhanced receiving performance as compared with area having more interference with the main data. Additionally, when using the system in which the known data are inserted in the data group and then transmitted, and when a long set of consecutive known data is to be periodically (or regularly) inserted in the enhanced data, the body area is capable of regularly receiving such enhanced data having a predetermined length. However, since the enhanced data may be mixed with the main data in the head and tail areas, it is difficult to regularly insert the known data in these areas, and it is also difficult to insert long known data sets that are consecutive in these areas.

Details such as the size of the data group, the number of hierarchical areas within the data group and the size of each hierarchical area, and the number of enhanced data bytes that may be inserted in each hierarchical area may vary depending upon the design of the system designer. Therefore, the above-described embodiment is merely an example that can facilitate the description of the present invention. In the group formatter 914, the data group may be configured to include a position (or place) in which the field synchronization signal is to be inserted. When assuming that the data group is divided into a plurality of hierarchical areas as described above, the block processor 913 may code the data that are to be inserted in each area at different coding rates.

In the present invention, based upon the areas that are each expected to show different performance after the equalization process when using the channel information that may be used for the channel equalization process in the receiving system, a different coding rate may be applied to each of these areas. For example, the block processor 913 codes the enhanced data that are to be inserted in the near head (NH) area and the first to fourth lower body (B1 to B4) areas at a 1/2-coding rate. Thereafter, the group formatter 914 may insert the 1/2-rate coded enhanced data in the near head (NH) area and the first to fourth lower body (B1 to B4) areas. On the other hand, the block processor 913 codes the enhanced data that are to be inserted in the middle head (MH) area and the near tail (NT) area at a 1/4-coding rate, which has greater error correction ability than the 1/2-coding rate. Subsequently, the group formatter 914 may insert the 1/2-rate coded enhanced data in the middle head (MH) area and the near tail (NT) area. Furthermore, the block processor 913 codes the enhanced data that are to be inserted in the far head (FH) area and the far tail (FT) area at a coding rate having even greater error correction ability than the 1/4-coding rate. Thereafter, the group formatter 914 may inserts the coded enhanced data either in the far head (FH) and far tail (FT) areas or in a reserved area for future usage.

Apart from the enhanced data, the group formatter 913 may also insert supplemental information data such as signaling information indicating the overall transmission information in the data group. Also, apart from the coded enhanced data outputted from the block processor 913, and in relation with the data deinterleaving process in a later process, the group formatter 914 may also insert a MPEG header place holder, a non-systematic RS parity place holder, and a main data place holder in the data group. Herein, the main data group place holder is inserted because the enhanced data and the main data may be mixed in the head and tail areas depending upon the input of the data deinterleaver. For example, based upon the output of the data after being deinterleaved, the place holder for the MPEG header may be allocated to the front of each data packet. Additionally, the group formatter 914 may either insert known data generated according to a pre-defined rule, or insert a known data place holder for inserting known data in a later process. Furthermore, a place holder for the initialization of the trellis encoder module 927 is inserted in a corresponding area. For example, the initialization data place holder may be inserted at the beginning (or front) of the data place sequence.

The output of the group formatter 914 is inputted to the data deinterleaver 915. And, the data deinterleaver 915 performs an inverse process of the data interleaver deinterleaving the data and place holder within the data group being outputted from the group formatter 914. Thereafter, the data deinterleaver 915 outputs the deinterleaved data to the packet formatter 916. Among the data deinterleaved and inputted, the packet formatter 916 removes the main data place holder and RS parity place holder that were allocated for the deinterleaving process from the inputted deinterleaved data. Thereafter, the remaining portion of the corresponding data is grouped, and 4 bytes of MPEG header are inserted therein. The 4-byte MPEG header is configured of a 1-byte MPEG synchronization byte added to the 3-byte MPEG header place holder.

When the group formatter 914 inserts the known data place holder, the packet formatter 916 may either insert actual known data in the known data place holder or output the known data place holder without any change or modification for a replacement insertion in a later process. Afterwards, the packet formatter 916 divides the data within the above-described packet-formatted data group into 188-byte unit enhanced data packets (i.e., MPEG TS packets), which are then provided to the packet multiplexer 921. The packet multiplexer 921 multiplexes the 188-byte unit enhanced data packet and main data packet outputted from the packet formatter 916 according to a pre-defined multiplexing method. Subsequently, the multiplexed data packets are outputted to the data randomizer 922. The multiplexing method may be modified or altered in accordance with diverse variables of the system design.

As an example of the multiplexing method of the packet multiplexer 921, the enhanced data burst section and the main data section may be identified along a time axis (or a chronological axis) and may be alternately repeated. At this point, the enhanced data burst section may transmit at least one data group, and the main data section may transmit only the main data. The enhanced data burst section may also transmit the main data. If the enhanced data are outputted in a burst structure, as described above, the receiving system receiving only the enhanced data may turn the power on only during the burst section so as to receive the enhanced data, and may turn the power off during the main data section in which main data are transmitted, so as to prevent the main data from being received, thereby reducing the power consumption of the receiving system.

When the data being inputted correspond to the main data packet, the data randomizer 922 performs the same randomizing process of the conventional randomizer. More specifically, the MPEG synchronization byte included in the main data packet is discarded and a pseudo random byte generated from the remaining 187 bytes is used so as to randomize the data. Thereafter, the randomized data are outputted to the RS encoder/non-systematic RS encoder 923. However, when the inputted data correspond to the enhanced data packet, the MPEG synchronization byte of the 4-byte MPEG header included in the enhanced data packet is discarded, and data randomizing is performed only on the remaining 3-byte MPEG header. Randomizing is not performed on the remaining portion of the enhanced data. Instead, the remaining portion of the enhanced data is outputted to the RS encoder/non-systematic RS encoder 923. This is because the randomizing process has already been performed on the enhanced data by the enhanced data randomizer 911 in an earlier process. Herein, a data randomizing process may or may not be performed on the known data (or known data place holder) and the initialization data place holder included in the enhanced data packet.

The RS encoder/non-systematic RS encoder 923 RS-codes the data randomized by the data randomizer 922 or the data bypassing the data randomizer 922. Then, the RS encoder/non-systematic RS encoder 923 adds a 20-byte RS parity to the coded data, thereby outputting the RS-parity-added data to the data interleaver 924. At this point, if the inputted data correspond to the main data packet, the RS encoder/non-systematic RS encoder 923 performs a systematic RS-coding process identical to that of the conventional receiving system on the inputted data, thereby adding the 20-byte RS parity at the end of the 187-byte data. Alternatively, if the inputted data correspond to the enhanced data packet, the 20 bytes of RS parity gained by performing the non-systematic RS-coding are respectively inserted in the decided parity byte places within the enhanced data packet. Herein, the data interleaver 924 corresponds to a byte unit convolutional interleaver. The output of the data interleaver 924 is inputted to the parity byte replacer 925 and the non-systematic RS encoder 926.

Meanwhile, a memory within the trellis encoding module 927, which is positioned after the parity byte replacer 925, should first be initialized in order to allow the output data of the trellis encoding module 927 so as to become the known data defined based upon an agreement between the receiving system and the transmitting system. More specifically, the memory of the trellis encoding module 927 should first be initialized before the known data sequence being inputted is trellis-encoded. At this point, the beginning of the known data sequence that is inputted corresponds to the initialization data place holder inserted by the group formatter 914 and not the actual known data. Therefore, a process of generating initialization data right before the trellis-encoding of the known data sequence being inputted and a process of replacing the initialization data place holder of the corresponding trellis encoding module memory with the newly generated initialization data are required.

A value of the trellis memory initialization data is decided based upon the memory status of the trellis encoding module 927, thereby generating the trellis memory initialization data accordingly. Due to the influence of the replace initialization data, a process of recalculating the RS parity, thereby replacing the RS parity outputted from the trellis encoding module 927 with the newly calculated RS parity is required. Accordingly, the non-systematic RS encoder 926 receives the enhanced data packet including the initialization data place holder that is to be replaced with the initialization data from the data interleaver 924 and also receives the initialization data from the trellis encoding module 927. Thereafter, among the received enhanced data packet, the initialization data place holder is replaced with the initialization data. Subsequently, the RS parity data added to the enhanced data packet are removed. Then, a new non-systematic RS parity is calculated and outputted to the parity byte replacer 925. Accordingly, the parity byte replacer 925 selects the output of the data interleaver 924 as the data within the enhanced data packet, and selects the output of the non-systematic RS encoder 926 as the RS parity. Thereafter, the parity byte replacer 925 outputs the selected data.

Meanwhile, if the main data packet is inputted, or if the enhanced data packet that does not include the initialization data place holder that is to be replaced, the parity byte replacer 925 selects the data and RS parity outputted from the data interleaver 924 and directly outputs the selected data to the trellis encoding module 927 without modification. The trellis encoding module 927 converts the byte-unit data to symbol-unit data and 12-way interleaves and trellis-encodes the converted data, which are then outputted to the frame multiplexer 928. The frame multiplexer 928 inserts field synchronization and segment synchronization signals in the output of the trellis encoding module 927 and then outputs the processed data to the transmitter 930. Herein, the transmitter 930 includes a pilot inserter 931, a modulator 932, and a radio frequency (RF) up-converter 933. The operation of the transmitter 930 is identical to the conventional transmitters. Therefore, a detailed description of the same will be omitted for simplicity.

Figure 15:
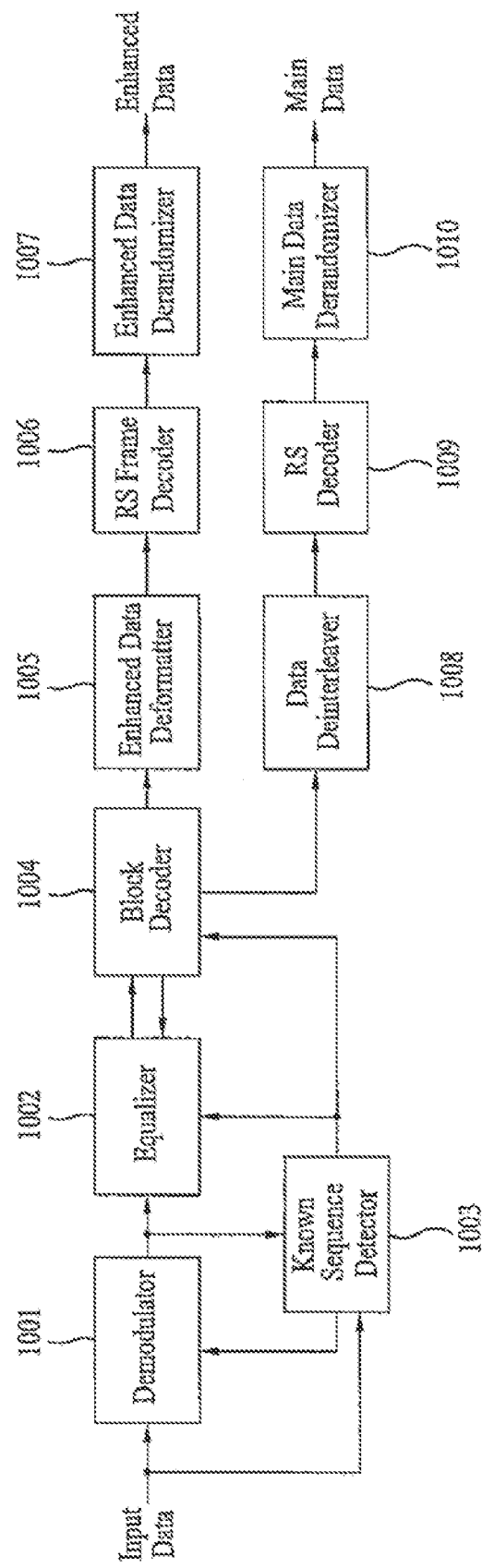
FIG. 15 illustrates a block diagram showing a general structure of a demodulating unit within a digital broadcast (or television or DTV) receiving system according to another embodiment of the present invention.

FIG. 15 illustrates a block diagram of a demodulating unit included in the receiving system according to another embodiment of the present invention. Herein, the demodulating unit may effectively process signals transmitted from the transmitting system shown in FIG. 14. Referring to FIG. 15, the demodulating unit includes a demodulator 1001, a channel equalizer 1002, a known data detector 1003, a block decoder 1004, an enhanced data deformatter 1005, a RS frame decoder 1006, an enhanced data derandomizer 1007, a data deinterleaver 1008, a RS decoder 1009, and a main data derandomizer 1010. For simplicity, the demodulator 1001, the channel equalizer 1002, the known data detector 1003, the block decoder 1004, the enhanced data deformatter 1005, the RS frame decoder 1006, and the enhanced data derandomizer 1007 will be referred to as an enhanced data processor. And, the data deinterleaver 1008, the RS decoder 1009, and the main data derandomizer 1010 will be referred to as a main data processor.

More specifically, the enhanced data including known data and the main data are received through the tuner and inputted to the demodulator 1001 and the known data detector 1003. The demodulator 1001 performs automatic gain control, carrier wave recovery, and timing recovery on the data that are being inputted, thereby creating baseband data, which are then outputted to the equalizer 1002 and the known data detector 1003. The equalizer 1002 compensates the distortion within the channel included in the demodulated data. Then, the equalizer 1002 outputs the compensated data to the block decoder 1004.

At this point, the known data detector 1003 detects the known data place inserted by the transmitting system to the input/output data of the demodulator 1001 (i.e., data prior to demodulation or data after demodulation). Then, along with the position information, the known data detector 1003 outputs the symbol sequence of the known data generated from the corresponding position to the demodulator 1001 and the equalizer 1002. Additionally, the known data detector 1003 outputs information enabling the block decoder 1004 to identify the enhanced data being additionally encoded by the transmitting system and the main data that are not additionally encoded to the block decoder 1004. Furthermore, although the connection is not shown in FIG. 15, the information detected by the known data detector 1003 may be used in the overall receiving system and may also be used in the enhanced data formatter 1005 and the RS frame decoder 1006.

By using the known data symbol sequence when performing the timing recovery or carrier wave recovery, the demodulating performance of the demodulator 1001 may be enhanced. Similarly, by using the known data, the channel equalizing performance of the channel equalizer 1002 may be enhanced. Furthermore, by feeding-back the demodulation result of the block demodulator 1004, the channel equalizing performance may also be enhanced. Herein, the channel equalizer 1002 may perform channel equalization through various methods. In the present invention, a method of estimating a channel impulse response (CIR) for performing the channel equalization process will be given as an example of the present invention. More specifically, in the present invention, the channel impulse response (CIR) is differently estimated and applied in accordance with each hierarchical area within the data group that are transmitted from the transmitting system. Furthermore, by using the known data having the position (or place) and contents pre-known according to an agreement between the transmitting system and the receiving system, so as to estimate the CIR, the channel equalization process may be processed with more stability.

In the present invention, one data group that is inputted for channel equalization is divided into three hierarchical areas: a head area, a body area, and a tail area. Then, each of the areas is divided into lower hierarchical areas. More specifically, the head area may be divided into a far head (FH) area, a middle head (MH) area, and a near head (NH) area. And, the tail area may be divided into a far tail (FT) area and a near tail (NT) area. Furthermore, based upon a long known data sequence, the body area may be divided into 4 lower hierarchical areas: a first lower body (B1) area, a second lower body (B2) area, a third lower body (B3) area, and a fourth lower body (B4) area. In performing channel equalization on the data within the data group by using the CIR estimated from the field synchronization signal and the known data sequence, and in accordance with the characteristic of each area, either one of the estimated CIRs may be directly used without modification, or a CIR created by interpolating or extrapolating a plurality of CIRs may be used.

Meanwhile, if the data being channel equalized and then inputted to the block decoder 1004 correspond to the enhanced data on which additional encoding and trellis encoding are both performed by the transmitting system, trellis-decoding and additional decoding processes are performed as inverse processes of the transmitting system. Alternatively, if the data being channel equalized and then inputted to the block decoder 1004 correspond to the main data on which additional encoding is not performed and only trellis-encoding is performed by the transmitting system, only the trellis-decoding process is performed. The data group decoded by the block decoder 1004 is inputted to the enhanced data deformatter 1005, and the main data packet is inputted to the data deinterleaver 1008.

More specifically, if the inputted data correspond to the main data, the block decoder 1004 performs Viterbi decoding on the inputted data, so as to either output a hard decision value or hard-decide a soft decision value and output the hard-decided result. On the other hand, if the inputted correspond to the enhanced data, the block decoder 1004 outputs either a hard decision value or a soft decision value on the inputted enhanced data. In other words, if the data inputted to the block decoder 1004 correspond to the enhanced data, the block decoder 1004 performs a decoding process on the data encoded by the block processor and the trellis encoder of the transmitting system. At this point, the output of the RS frame encoder included in the pre-processor of the transmitting system becomes an external code, and the output of the block processor and the trellis encoder becomes an internal code. In order to show maximum performance of the external code when decoding such connection codes, the decoder of the internal code should output a soft decision value. Therefore, the block decoder 1004 may output a hard decision value on the enhanced data. However, when required, it is more preferable that the block decoder 1004 outputs a soft decision value.

The present invention may also be used for configuring a reliability map using the soft decision value. The reliability map determines and indicates whether a byte corresponding to a group of B bits decided by the code of the soft decision value is reliable. For example, when an absolute value of the soft decision value exceeds a pre-determined threshold value, the value of the bit corresponding to the soft decision value code is determined to be reliable. However, if the absolute value does not exceed the pre-determined threshold value, then the value of the corresponding bit is determined to be not reliable. Further, if at least one bit among the group of 8 bits, which are determined based upon the soft decision value, is determined to be not reliable, then the reliability map indicates that the entire byte is not reliable. Herein, the process of determining the reliability by 1-bit units is merely exemplary.

The corresponding byte may also be indicated to be not reliable if a plurality of bits (e.g., 4 bits) is determined to be not reliable.

Conversely, when all of the bits are determined to be reliable within one byte (i.e., when the absolute value of the soft value of all bits exceeds the pre-determined threshold value), then the reliability map determines and indicates that the corresponding data byte is reliable. Similarly, when more than 4 bits are determined to be reliable within one data byte, then the reliability map determines and indicates that the corresponding data byte is reliable. The estimated numbers are merely exemplary and do not limit the scope and spirit of the present invention. Herein, the reliability map may be used when performing error correction decoding processes.

Meanwhile, the data deinterleaver 1008, the RS decoder 1009, and the main data derandomizer 1010 are blocks required for receiving the main data. These blocks may not be required in a receiving system structure that receives only the enhanced data. The data deinterleaver 1008 performs an inverse process of the data interleaver of the transmitting system. More specifically, the data deinterleaver 1008 deinterleaves the main data being outputted from the block decode 1004 and outputs the deinterleaved data to the RS decoder 1009. The RS decoder 1009 performs systematic RS decoding on the deinterleaved data and outputs the systematically decoded data to the main data derandomizer 1010. The main data derandomizer 1010 receives the data outputted from the RS decoder 1009 so as to generate the same pseudo random byte as that of the randomizer in the transmitting system. The main data derandomizer 1010 then performs a bitwise exclusive OR (XOR) operation on the generated pseudo random data byte, thereby inserting the MPEG synchronization bytes to the beginning of each packet so as to output the data in 188-byte main data packet units.

Herein, the format of the data being outputted to the enhanced data deformatter 1005 from the block decoder 1004 is a data group format. At this point, the enhanced data deformatter 1005 already knows the structure of the input data. Therefore, the enhanced data deformatter 1005 identifies the system information including signaling information and the enhanced data from the data group. Thereafter, the identified signaling information is transmitted to where the system information is required, and the enhanced data are outputted to the RS frame decoder 1006. The enhanced data deformatter 1005 removes the known data, trellis initialization data, and MPEG header that were included in the main data and the data group and also removes the RS parity that was added by the RS encoder/non-systematic RS encoder of the transmitting system. Thereafter, the processed data are outputted to the RS frame decoder 1006.

More specifically, the RS frame decoder 1006 receives the RS-coded and CRC-coded enhanced data from the enhanced data deformatter 1005 so as to configure the RS frame. The RS frame decoder 1006 performs an inverse process of the RS frame encoder included in the transmitting system, thereby correcting the errors within the RS frame. Then, the 1-byte MPEG synchronization byte, which was removed during the RS frame coding process, is added to the error corrected enhanced data packet. Subsequently, the processed data are outputted to the enhanced data derandomizer 1007. Herein, the enhanced data derandomizer 1007 performs a derandomizing process, which corresponds to an inverse process of the enhanced data randomizer included in the transmitting system, on the received enhanced data. Then, by outputting the processed data, the enhanced data transmitted from the transmitting system can be obtained.

According to an embodiment of the present invention, the RS frame decoder 1006 may also be configured as follows. The RS frame decoder 1006 may perform a CRC syndrome check on the RS frame, thereby verifying whether or not an error has occurred in each row. Subsequently, the CRC checksum is removed and the presence of an error is indicated on a CRC error flag corresponding to each row. Then, a RS decoding process is performed on the RS frame having the CRC checksum removed in a column direction. At this point, depending upon the number of CRC error flags, a RS erasure decoding process may be performed. More specifically, by checking the CRC error flags corresponding to each row within the RS frame, the number of CRC error flags may be determined whether it is greater or smaller than the maximum number of errors, when RS decoding the number of rows with errors (or erroneous rows) in the column direction. Herein, the maximum number of errors corresponds to the number of parity bytes inserted during the RS decoding process. As an example of the present invention, it is assumed that 48 parity bytes are added to each, column.

If the number of rows with CRC errors is equal to or smaller than the maximum number of errors (e.g., 48), which may be corrected by the RS erasure decoding process, the RS erasure decoding process is performed on the RS frame in the column direction. Thereafter, the 48 bytes of parity data that were added at the end of each column are removed. However, if the number of rows with CRC errors is greater than the maximum number of errors (e.g., 48), which may be corrected by the RS erasure decoding process, the RS erasure decoding process cannot be performed. In this case, the error may be corrected by performing a general RS decoding process.

As another embodiment of the present invention, the error correction ability may be enhanced by using the reliability map created when configuring the RS frame from the soft decision value. More specifically, the RS frame decoder 1006 compares the absolute value of the soft decision value obtained from the block decoder 1004 to the pre-determined threshold value so as to determine the reliability of the bit values that are decided by the code of the corresponding soft decision value. Then, 8 bits are grouped to configure a byte. Then, the reliability information of the corresponding byte is indicated on the reliability map. Therefore, even if a specific row is determined to have CRC errors as a result of the CRC syndrome checking process of the corresponding row, it is not assumed that all of the data bytes included in the corresponding row have error. Instead, only the data bytes that are determined to be not reliable, after referring to the reliability information on the reliability map, are set to have errors. In other words, regardless of the presence of CRC errors in the corresponding row, only the data bytes that are determined to be not reliable (or unreliable) by the reliability map are set as erasure points.

Thereafter, if the number of erasure points for each column is equal to or smaller than the maximum number of errors (e.g., 48), the RS erasure decoding process is performed on the corresponding the column. Conversely, if the number of erasure points is greater than the maximum number of errors (e.g., 48), which may be corrected by the RS erasure decoding process, a general decoding process is performed on the corresponding column. In other words, if the number of rows having CRC errors is greater than the maximum number of errors (e.g., 48), which may be corrected by the RS erasure decoding process, either a RS erasure decoding process or a general RS decoding process is performed on a particular column in accordance with the number of erasure point within the corresponding column, wherein the number is decided based upon the reliability information on the reliability map. When the above-described process is performed, the error correction decoding process is performed in the direction of all of the columns included in the RS frame. Thereafter, the 48 bytes of parity data added to the end of each column are removed.

Figure 16:
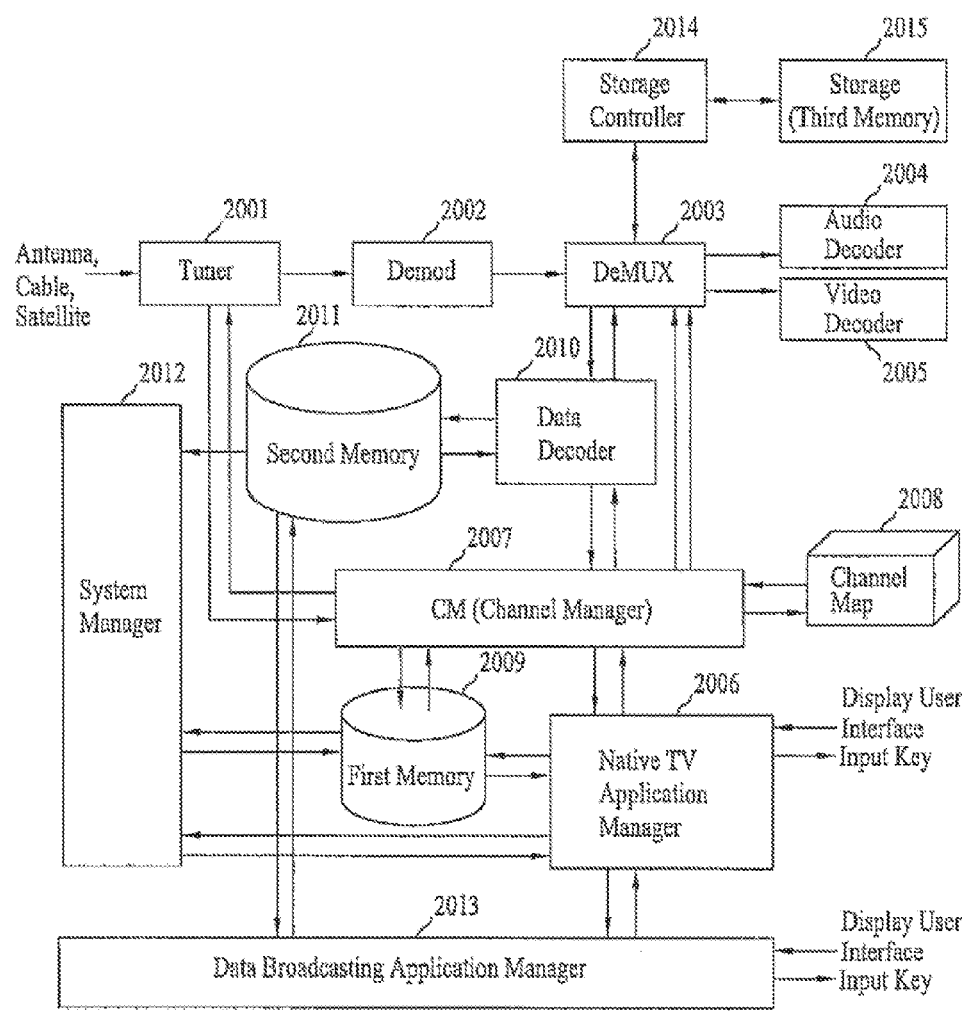
FIG. 16 illustrates a block diagram showing the structure of a digital broadcast (or television or DTV) receiving system according to an embodiment of the present invention.

FIG. 16 illustrates a block diagram showing the structure of a digital broadcast receiving system according to an embodiment of the present invention. Referring to FIG. 16, the digital broadcast receiving system includes a tuner 2001, a demodulating unit 2002, a demultiplexer 2003, an audio decoder 2004, a video decoder 2005, a native TV application manager 2006, a channel manager 2007, a channel map 2008, a first memory 2009, a data decoder 2010, a second memory 2011, a system manager 2012, a data broadcasting application manager 2013, a storage controller 2014, and a third memory 2015. Herein, the third memory 2015 is a mass storage device, such as a hard disk drive (HDD) or a memory chip. The tuner 2001 tunes a frequency of a specific channel through any one of an antenna, cable, and satellite. Then, the tuner 2001 down-converts the tuned frequency to an intermediate frequency (IF), which is then outputted to the demodulating unit 2002. At this point, the tuner 2001 is controlled by the channel manager 2007. Additionally, the result and strength of the broadcast signal of the tuned channel are also reported to the channel manager 2007. The data that are being received by the frequency of the tuned specific channel include main data, enhanced data, and table data for decoding the main data and enhanced data.

In the embodiment of the present invention, examples of the enhanced data may include data provided for data service, such as Java application data, HTML application data, XML data, and so on. The data provided for such data services may correspond either to a Java class file for the Java application, or to a directory file designating positions (or locations) of such files. Furthermore, such data may also correspond to an audio file and/or a video file used in each application. The data services may include weather forecast services, traffic information services, stock information services, services providing information quiz programs providing audience participation services, real time poll, user interactive education programs, gaming services, services providing information on soap opera (or TV series) synopsis, characters, original sound track, filing sites, services providing information on past sports matches, profiles and accomplishments of sports players, product information and product ordering services, services providing information on broadcast programs by media type, airing time, subject, and so on. The types of data services described above are only exemplary and are not limited only to the examples given herein. Furthermore, depending upon the embodiment of the present invention, the enhanced data may correspond to meta data. For example, the meta data use the XML application so as to be transmitted through a DSM-CC protocol.

The demodulating unit 2002 performs demodulation and channel equalization on the signal being outputted from the tuner 2001, thereby identifying the main data and the enhanced data. Thereafter, the identified main data and enhanced data are outputted in TS packet units. Examples of the demodulating unit 2002 is shown in FIG. 13 and FIG. 15. The demodulating unit shown in FIG. 13 and FIG. 15 is merely exemplary and the scope of the present invention is not limited to the examples set forth herein. In the embodiment given as an example of the present invention, only the enhanced data packet outputted from the demodulating unit 2002 is inputted to the demultiplexer 2003. In this case, the main data packet is inputted to another demultiplexer (not shown) that processes main data packets. Herein, the storage controller 2014 is also connected to the other demultiplexer in order to store the main data after processing the main data packets. The demultiplexer of the present invention may also be designed to process both enhanced data packets and main data packets in a single demultiplexer.

The storage controller 2014 is interfaced with the demultiplexer so as to control instant recording, reserved (or pre-programmed) recording, time shift, and so on of the enhanced data and/or main data. For example, when one of instant recording, reserved (or pre-programmed) recording, and time shift is set and programmed in the receiving system (or receiver) shown in FIG. 16, the corresponding enhanced data and/or main data that are inputted to the demultiplexer are stored in the third memory 2015 in accordance with the control of the storage controller 2014. The third memory 2015 may be described as a temporary storage area and/or a permanent storage area. Herein, the temporary storage area is used for the time shifting function, and the permanent storage area is used for a permanent storage of data according to the user's choice (or decision).

When the data stored in the third memory 2015 need to be reproduced (or played), the storage controller 2014 reads the corresponding data stored in the third memory 2015 and outputs the read data to the corresponding demultiplexer (e.g., the enhanced data are outputted to the demultiplexer 2003 shown in FIG. 16). At this point, according to the embodiment of the present invention, since the storage capacity of the third memory 2015 is limited, the compression encoded enhanced data and/or main data that are being inputted are directly stored in the third memory 2015 without any modification for the efficiency of the storage capacity. In this case, depending upon the reproduction (or reading) command, the data read from the third memory 2015 pass trough the demultiplexer so as to be inputted to the corresponding decoder, thereby being restored to the initial state.

The storage controller 2014 may control the reproduction (or play), fast-forward, rewind, slow motion, instant replay functions of the data that are already stored in the third memory 2015 or presently being buffered. Herein, the instant replay function corresponds to repeatedly viewing scenes that the viewer (or user) wishes to view once again. The instant replay function may be performed on stored data and also on data that are currently being received in real time by associating the instant replay function with the time shift function. If the data being inputted correspond to the analog format, for example, if the transmission mode is NTSC, PAL, and so on, the storage controller 2014 compression encodes the inputted data and stored the compression-encoded data to the third memory 2015. In order to do so, the storage controller 2014 may include an encoder, wherein the encoder may be embodied as one of software, middleware, and hardware. Herein, an MPEG encoder may be used as the encoder according to an embodiment of the present invention. The encoder may also be provided outside of the storage controller 2014.

Meanwhile, in order to prevent illegal duplication (or copies) of the input data being stored in the third memory 2015, the storage controller 2014 scrambles the input data and stores the scrambled data in the third memory 2015. Accordingly, the storage controller 2014 may include a scramble algorithm for scrambling the data stored in the third memory 2015 and a descramble algorithm for descrambling the data read from the third memory 2015. Herein, the definition of scramble includes encryption, and the definition of descramble includes decryption. The scramble method may include using an arbitrary key (e.g., control word) to modify a desired set of data, and also a method of mixing signals.

Meanwhile, the demultiplexer 2003 receives the real-time data outputted from the demodulating unit 2002 or the data read from the third memory 2015 and demultiplexes the received data. In the example given in the present invention, the demultiplexer 2003 performs demultiplexing on the enhanced data packet. Therefore, in the present invention, the receiving and processing of the enhanced data will be described in detail. It should also be noted that a detailed description of the processing of the main data will be omitted for simplicity starting from the description of the demultiplexer 2003 and the subsequent elements.

The demultiplexer 2003 demultiplexes enhanced data and program specific information/program and system information protocol (PSI/PSIP) tables from the enhanced data packet inputted in accordance with the control of the data decoder 2010. Thereafter, the demultiplexed enhanced data and PSI/PSIP tables are outputted to the data decoder 2010 in a section format. In order to extract the enhanced data from the channel through which enhanced data are transmitted and to decode the extracted enhanced data, system information is required. Such system information may also be referred to as service information. The system information may include channel information, event information, etc. In the embodiment of the present invention, the PSI/PSIP tables are applied as the system information. However, the present invention is not limited to the example set forth herein. More specifically, regardless of the name, any protocol transmitting system information in a table format may be applied in the present invention.

The PSI table is an MPEG-2 system standard defined for identifying the channels and the programs. The PSIP table is an advanced television systems committee (ATSC) standard that can identify the channels and the programs. The PSI table may include a program association table (PAT), a conditional access table (CAT), a program map table (PMT), and a network information table (NIT). Herein, the PAT corresponds to special information that is transmitted by a data packet having a PID of '0'. The PAT transmits PID information of the PMT and PID information of the NIT corresponding to each program. The CAT transmits information on a paid broadcast system used by the transmitting system. The PMT transmits PID information of a transport stream (TS) packet, in which program identification numbers and individual bit sequences of video and audio data configuring the corresponding program are transmitted, and the PID information, in which PCR is transmitted. The NIT transmits information of the actual transmission network.

The PSIP table may include a virtual channel table (VCT), a system time table (STT), a rating region table (RRT), an extended text table (ETT), a direct channel change table (DCCT), an event information table (EIT), and a master guide table (MGT). The VCT transmits information on virtual channels, such as channel information for selecting channels and information such as packet identification (PID) numbers for receiving the audio and/or video data. More specifically, when the VCT is parsed, the PID of the audio/video data of the broadcast program may be known. Herein, the corresponding audio/video data are transmitted within the channel along with the channel name and the channel number. The STT transmits information on the current data and timing information. The RRT transmits information on region and consultation organs for program ratings. The ETT transmits additional description of a specific channel and broadcast program. The EIT transmits information on virtual channel events (e.g., program title, program start time, etc.). The DCCT/DCCSCT transmits information associated with automatic (or direct) channel change. And, the MGT transmits the versions and PID information of the above-mentioned tables included in the PSIP.

Each of the above-described tables included in the PSI/PSIP is configured of a basic unit referred to as a "section", and a combination of one or more sections forms a table. For example, the VCT may be divided into 256 sections. Herein, one section may include a plurality of virtual channel information. However, a single set of virtual channel information is not divided into two or more sections. At this point, the receiving system may parse and decode the data for the data service that are transmitting by using only the tables included in the PSI, or only the tables included in the PISP, or a combination of tables included in both the PSI and the PSIP. In order to parse and decode the data for the data service, at least one of the PAT and PMT included in the PSI, and the VCT included in the PSIP is required. For example, the PAT may include the system information for transmitting the data corresponding to the data service, and the PID of the PMT corresponding to the data service data (or program number). The PMT may include the PID of the TS packet used for transmitting the data service data. The VCT may include information on the virtual channel for transmitting the data service data, and the PID of the TS packet for transmitting the data service data.

Meanwhile, depending upon the embodiment of the present invention, a DVB-SI may be applied instead of the PSIP. The DVB-SI may include a network information table (NIT), a service description table (SDT), an event information table (EIT), and a time and data table (TDT). The DVB-SI may be used in combination with the above-described PSI. Herein, the NIT divides the services corresponding to particular network providers by specific groups. The NIT includes all tuning information that are used during the IRD set-up. The NIT may be used for informing or notifying any change in the tuning information. The SDT includes the service name and different parameters associated with each service corresponding to a particular MPEG multiplex. The EIT is used for transmitting information associated with all events occurring in the MPEG multiplex. The EIT includes information on the current transmission and also includes information selectively containing different transmission streams that may be received by the IRD. And, the TDT is used for updating the clock included in the IRD.

Furthermore, three selective SI tables (i.e., a bouquet associate table (BAT), a running status table (RST), and a stuffing table (ST)) may also be included. More specifically, the bouquet associate table (BAT) provides a service grouping method enabling the IRD to provide services to the viewers. Each specific service may belong to at least one 'bouquet' unit. A running status table (RST) section is used for promptly and instantly updating at least one event execution status. The execution status section is transmitted only once at the changing point of the event status. Other SI tables are generally transmitted several times. The stuffing table (ST) may be used for replacing or discarding a subsidiary table or the entire SI tables.

In the present invention, the enhanced data included in the payload within the TS packet consist of a digital storage media-command and control (DSM-CC) section format. However, the TS packet including the data service data may correspond either to a packetized elementary stream (PES) type or to a section type. More specifically, either the PES type data service data configure the TS packet, or the section type data service data configure the TS packet. The TS packet configured of the section type data will be given as the example of the present invention. At this point, the data service data are includes in the digital storage media-command and control (DSM-CC) section. Herein, the DSM-CC section is then configured of a 188-byte unit TS packet.

Furthermore, the packet identification of the TS packet configuring the DSM-CC section is included in a data service table (DST). When transmitting the DST, '0x 95' is assigned as the value of a stream_type field included in the service location descriptor of the PMT or the VCT. More specifically, when the PMT or VCT stream_type field value is '0x 95', the receiving system may acknowledge that data broadcasting including enhanced data (i.e., the enhanced data) is being received. At this point, the enhanced data may be transmitted by a data carousel method. The data carousel method corresponds to repeatedly transmitting identical data on a regular basis.

At this point, according to the control of the data decoder 2010, the demultiplexer 2003 performs section filtering, thereby discarding repetitive sections and outputting only the non-repetitive sections to the data decoder 2010. The demultiplexer 2003 may also output only the sections configuring desired tables (e.g., VCT) to the data decoder 2010 by section filtering. Herein, the VCT may include a specific descriptor for the enhanced data. However, the present invention does not exclude the possibilities of the enhanced data being included in other tables, such as the PMT. The section filtering method may include a method of verifying the PID of a table defined by the MGT, such as the VCT, prior to performing the section filtering process. Alternatively, the section filtering method may also include a method of directly performing the section filtering process without verifying the MGT, when the VCT includes a fixed PID (i.e., a base PID). At this point, the demultiplexer 2003 performs the section filtering process by referring to a table_id field, a version number field, a section_number field, etc.

As described above, the method of defining the PID of the VCT broadly includes two different methods. Herein, the PID of the VCT is a packet identifier required for identifying the VCT from other tables. The first method consists of setting the PID of the VCT so that it is dependent to the MGT. In this case, the receiving system cannot directly verify the VCT among the many PSI and/or PSIP tables. Instead, the receiving system must check the PID defined in the MGT in order to read the VCT. Herein, the MGT defines the PID, size, version number, and so on, of diverse tables. The second method consists of setting the PID of the VCT so that the PID is given a base PID value (or a fixed PID value), thereby being independent from the MGT. In this case, unlike in the first method, the VCT according to the present invention may be identified without having to verify every single PID included in the MGT. Evidently, an agreement on the base PID must be previously made between the transmitting system and the receiving system.

Meanwhile, in the embodiment of the present invention, the demultiplexer 2003 may output only an application information table (AIT) to the data decoder 2010 by section filtering. The AIT includes information on an application being operated in the receiving system for the data service. The AIT may also be referred to as an XAIT, and an AMT. Therefore, any table including application information may correspond to the following description. When the AIT is transmitted, a value of '0x 05' may be assigned to a stream_type field of the PMT. The AIT may include application information, such as application name, application version, application priority, application ID, application status (i.e., auto-start, user-specific settings, kill, etc.), application type (i.e., Java or HTML), position (or location) of stream including application class and data files, application platform directory, and location of application icon.

In the method for detecting application information for the data service by using the AIT, component_tag, original_network_id, transport_stream_id, and service_id fields may be used for detecting the application information. The component_tag field designates an elementary stream carrying a DSI of a corresponding object carousel. The original_network_id field indicates a DVB-SI original_network_id of the TS providing transport connection. The transport_stream_id field indicates the MPEG TS of the TS providing transport connection, and the service_id field indicates the DVB-SI of the service providing transport connection. Information on a specific channel may be obtained by using the original_network_id field, the transport_stream_id field, and the service_id field. The data service data, such as the application data, detected by using the above-described method may be stored in the second memory 2011 by the data decoder 2010.

The data decoder 2010 parses the DSM-CC section configuring the demultiplexed enhanced data. Then, the enhanced data corresponding to the parsed result are stored as a database in the second memory 2011. The data decoder 2010 groups a plurality of sections having the same table identification (table_id) so as to configure a table, which is then parsed. Thereafter, the parsed result is stored as a database in the second memory 2011. At this point, by parsing data and/or sections, the data decoder 2010 reads all of the remaining actual section data that are not section-filtered by the demultiplexer 2003. Then, the data decoder 2010 stores the read data to the second memory 2011. The second memory 2011 corresponds to a table and data carousel database storing system information parsed from tables and enhanced data parsed from the DSM-CC section. Herein, a table_id field, section_number field, and a last_section_number field included in the table may be used to indicate whether the corresponding table is configured of a single section or a plurality of sections. For example, TS packets having the PID of the VCT are grouped to form a section, and sections having table identifiers allocated to the VCT are grouped to form the VCT.

When the VCT is parsed, information on the virtual channel to which enhanced data are transmitted may be obtained. The obtained application identification information, service component identification information, and service information corresponding to the data service may either be stored in the second memory 2011 or be outputted to the data broadcasting application manager 2013. In addition, reference may be made to the application identification information, service component identification information, and service information in order to decode the data service data. Alternatively, such information may also prepare the operation of the application program for the data service. Furthermore, the data decoder 2010 controls the demultiplexing of the system information table, which corresponds to the information table associated with the channel and events. Thereafter, an A.V PID list may be transmitted to the channel manager 2007.

The channel manager 2007 may refer to the channel map 2008 in order to transmit a request for receiving system-related information data to the data decoder 2010, thereby receiving the corresponding result. In addition, the channel manager 2007 may also control the channel tuning of the tuner 2001. Furthermore, the channel manager 2007 may directly control the demultiplexer 2003, so as to set up the A/V PID, thereby controlling the audio decoder 2004 and the video decoder 2005. The audio decoder 2004 and the video decoder 2005 may respectively decode and output the audio data and video data demultiplexed from the main data packet. Alternatively, the audio decoder 2004 and the video decoder 2005 may respectively decode and output the audio data and video data demultiplexed from the enhanced data packet. Meanwhile, when the enhanced data include data service data, and also audio data and video data, it is apparent that the audio data and video data demultiplexed by the demultiplexer 2003 are respectively decoded by the audio decoder 2004 and the video decoder 2005. For example, an audio-coding (AC)-3 decoding algorithm may be applied to the audio decoder 2004, and a MPEG-2 decoding algorithm may be applied to the video decoder 2005.

Meanwhile, the native TV application manager 2006 operates a native application program stored in the first memory 2009, thereby performing general functions such as channel change. The native application program refers to software stored in the receiving system upon shipping of the product. More specifically, when a user request (or command) is transmitted to the receiving system through a user interface (UI), the native TV application manger 2006 displays the user request on a screen through a graphic user interface (GUI), thereby responding to the user's request. The user interface receives the user request through an input device, such as a remote controller, a key pad, a jog controller, an a touch-screen provided on the screen, and then outputs the received user request to the native TV application manager 2006 and the data broadcasting application manager 2013. Furthermore, the native TV application manager 2006 controls the channel manager 2007, thereby controlling channel-associated, such as the management of the channel map 2008, and controlling the data decoder 2010. The native TV application manager 2006 also controls the GUI of the overall receiving system, thereby storing the user request and status of the receiving system in the first memory 2009 and restoring the stored information.

The channel manager 2007 controls the tuner 2001 and the data decoder 2010, so as to managing the channel map 2008 so that it can respond to the channel request made by the user. More specifically, channel manager 2007 sends a request to the data decoder 2010 so that the tables associated with the channels that are to be tuned are parsed. The results of the parsed tables are reported to the channel manager 2007 by the data decoder 2010. Thereafter, based on the parsed results, the channel manager 2007 updates the channel map 2008 and sets up a PID in the demultiplexer 2003 for demultiplexing the tables associated with the data service data from the enhanced data.

The system manager 2012 controls the booting of the receiving system by turning the power on or off. Then, the system manager 2012 stores ROM images (including downloaded software images) in the first memory 2009. More specifically, the first memory 2009 stores management programs such as operating system (OS) programs required for managing the receiving system and also application program executing data service functions. The application program is a program processing the data service data stored in the second memory 2011 so as to provide the user with the data service. If the data service data are stored in the second memory 2011, the corresponding data service data are processed by the above-described application program or by other application programs, thereby being provided to the user. The management program and application program stored in the first memory 2009 may be updated or corrected to a newly downloaded program. Furthermore, the storage of the stored management program and application program is maintained without being deleted even if the power of the system is shut down. Therefore, when the power is supplied the programs may be executed without having to be newly downloaded once again.

The application program for providing data service according to the present invention may either be initially stored in the first memory 2009 upon the shipping of the receiving system, or be stored in the first 2009 after being downloaded. The application program for the data service (i.e., the data service providing application program) stored in the first memory 2009 may also be deleted, updated, and corrected. Furthermore, the data service providing application program may be downloaded and executed along with the data service data each time the data service data are being received.

When a data service request is transmitted through the user interface, the data broadcasting application manager 2013 operates the corresponding application program stored in the first memory 2009 so as to process the requested data, thereby providing the user with the requested data service. And, in order to provide such data service, the data broadcasting application manager 2013 supports the graphic user interface (GUI). Herein, the data service may be provided in the form of text (or short message service (SMS)), voice message, still image, and moving image. The data broadcasting application manager 2013 may be provided with a platform for executing the application program stored in the first memory 2009. The platform may be, for example, a Java virtual machine for executing the Java program. Hereinafter, an example of the data broadcasting application manager 2013 executing the data service providing application program stored in the first memory 2009, so as to process the data service data stored in the second memory 2011, thereby providing the user with the corresponding data service will now be described in detail.

Assuming that the data service corresponds to a traffic information service, the data service according to the present invention is provided to the user of a receiving system that is not equipped with an electronic map and/or a GPS system in the form of at least one of a text (or short message service (SMS)), a voice message, a graphic message, a still image, and a moving image. In this case, is a GPS module is mounted on the receiving system shown in FIG. 16, the GPS module receives satellite signals transmitted from a plurality of low earth orbit satellites and extracts the current position (or location) information (e.g., longitude, latitude, altitude), thereby outputting the extracted information to the data broadcasting application manager 2013.

At this point, it is assumed that the electronic map including information on each link and nod and other diverse graphic information are stored in one of the second memory 2011, the first memory 2009, and another memory that is not shown. More specifically, according to the request made by the data broadcasting application manager 2013, the data service data stored in the second memory 2011 are read and inputted to the data broadcasting application manager 2013. The data broadcasting application manager 2013 translates (or deciphers) the data service data read from the second memory 2011, thereby extracting the necessary information according to the contents of the message and/or a control signal.

Figure 17:
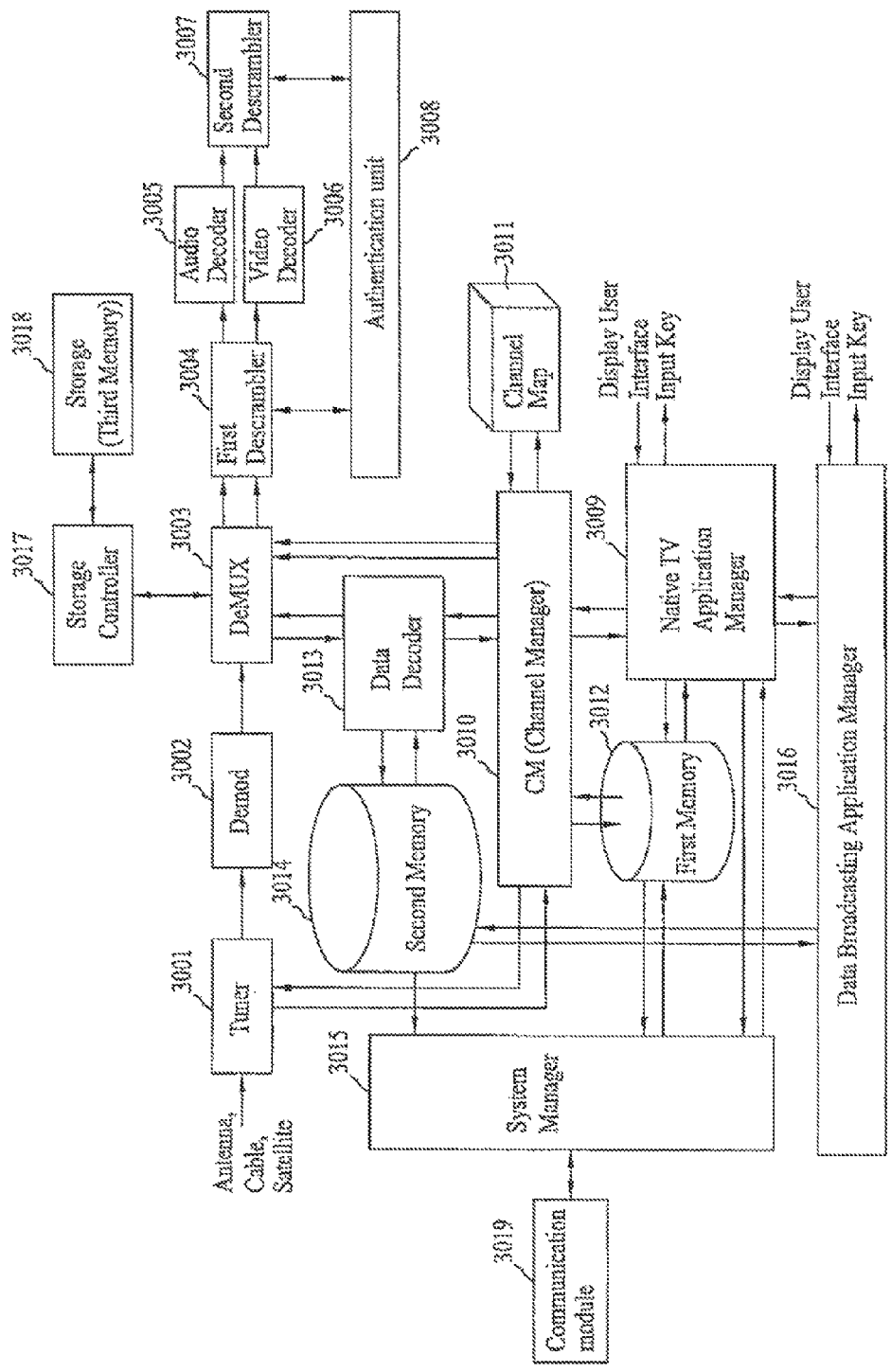
FIG. 17 illustrates a block diagram showing the structure of a digital broadcast (or television or DTV) receiving system according to another embodiment of the present invention.

FIG. 17 illustrates a block diagram showing the structure of a digital broadcast (or television) receiving system according to another embodiment of the present invention. Referring to FIG. 17, the digital broadcast receiving system includes a tuner 3001, a demodulating unit 3002, a demultiplexer 3003, a first descrambler 3004, an audio decoder 3005, a video decoder 3006, a second descrambler 3007, an authentication unit 3008, a native TV application manager 3009, a channel manager 3010, a channel map 3011, a first memory 3012, a data decoder 3013, a second memory 3014, a system manager 3015, a data broadcasting application manager 3016, a storage controller 3017, a third memory 3018, and a telecommunication module 3019. Herein, the third memory 3018 is a mass storage device, such as a hard disk drive (HDD) or a memory chip. Also, during the description of the digital broadcast (or television or DTV) receiving system shown in FIG. 17, the components that are identical to those of the digital broadcast receiving system of FIG. 16 will be omitted for simplicity.

As described above, in order to provide services for preventing illegal duplication (or copies) or illegal viewing of the enhanced data and/or main data that are transmitted by using a broadcast network, and to provide paid broadcast services, the transmitting system may generally scramble and transmit the broadcast contents. Therefore, the receiving system needs to descrambled the scrambled broadcast contents in order to provide the user with the proper broadcast contents. Furthermore, the receiving system may generally be processed with an authentication process with an authentication means before the descrambling process. Hereinafter, the receiving system including an authentication means and a descrambling means according to an embodiment of the present invention will now be described in detail.

According to the present invention, the receiving system may be provided with a descrambling means receiving scrambled broadcasting contents and an authentication means authenticating (or verifying) whether the receiving system is entitled to receive the descrambled contents. Hereinafter, the descrambling means will be referred to as first and second descramblers 3004 and 3007, and the authentication means will be referred to as an authentication unit 3008. Such naming of the corresponding components is merely exemplary and is not limited to the terms suggested in the description of the present invention. For example, the units may also be referred to as a decryptor. Although FIG. 17 illustrates an example of the descramblers 3004 and 3007 and the authentication unit 3008 being provided inside the receiving system, each of the descramblers 3004 and 3007 and the authentication unit 3008 may also be separately provided in an internal or external module. Herein, the module may include a slot type, such as a SD or CF memory, a memory stick type, a USB type, and so on, and may be detachably fixed to the receiving system.

As described above, when the authentication process is performed successfully by the authentication unit 3008, the scrambled broadcasting contents are descrambled by the descramblers 3004 and 3007, thereby being provided to the user. At this point, a variety of the authentication method and descrambling method may be used herein. However, an agreement on each corresponding method should be made between the receiving system and the transmitting system. Hereinafter, the authentication and descrambling methods will now be described, and the description of identical components or process steps will be omitted for simplicity.

The receiving system including the authentication unit 3008 and the descramblers 3004 and 3007 will now be described in detail. The receiving system receives the scrambled broadcasting contents through the tuner 3001 and the demodulating unit 3002. Then, the system manager 3015 decides whether the received broadcasting contents have been scrambled. Herein, the demodulating unit 3002 may be included as a demodulating means according to embodiments of the present invention as described in FIG. 13 and FIG. 15. However, the present invention is not limited to the examples given in the description set forth herein. If the system manager 3015 decides that the received broadcasting contents have been scrambled, then the system manager 3015 controls the system to operate the authentication unit 3008. As described above, the authentication unit 3008 performs an authentication process in order to decide whether the receiving system according to the present invention corresponds to a legitimate host entitled to receive the paid broadcasting service. Herein, the authentication process may vary in accordance with the authentication methods.

For example, the authentication unit 3008 may perform the authentication process by comparing an IP address of an IP datagram within the received broadcasting contents with a specific address of a corresponding host. At this point, the specific address of the corresponding receiving system (or host) may be a MAC address. More specifically, the authentication unit 3008 may extract the IP address from the decapsulated IP datagram, thereby obtaining the receiving system information that is mapped with the IP address. At this point, the receiving system should be provided, in advance, with information (e.g., a table format) that can map the IF address and the receiving system information. Accordingly, the authentication unit 3008 performs the authentication process by determining the conformity between the address of the corresponding receiving system and the system information of the receiving system that is mapped with the IP address. In other words, if the authentication unit 3008 determines that the two types of information conform to one another, then the authentication unit 3008 determines that the receiving system is entitled to receive the corresponding broadcasting contents.

In another example, standardized identification information is defined in advance by the receiving system and the transmitting system. Then, the identification information of the receiving system requesting the paid broadcasting service is transmitted by the transmitting system. Thereafter, the receiving system determines whether the received identification information conforms with its own unique identification number, so as to perform the authentication process. More specifically, the transmitting system creates a database for storing the identification information (or number) of the receiving system requesting the paid broadcasting service. Then, if the corresponding broadcasting contents are scrambled, the transmitting system includes the identification information in the EMM, which is then transmitted to the receiving system.

If the corresponding broadcasting contents are scrambled, messages (e.g., entitlement control message (ECM), entitlement management message (EMM)), such as the CAS information, mode information, message position information, that are applied to the scrambling of the broadcasting contents are transmitted through a corresponding data header or anther data packet. The ECM may include a control word (CW) used for scrambling the broadcasting contents. At this point, the control word may be encoded with an authentication key. The EMM may include an authentication key and entitlement information of the corresponding data. Herein, the authentication key may be encoded with a receiving system-specific distribution key. In other words, assuming that the enhanced data are scrambled by using the control word, and that the authentication information and the descrambling information are transmitted from the transmitting system, the transmitting system encodes the CW with the authentication key and, then, includes the encoded CW in the entitlement control message (ECM), which is then transmitted to the receiving system. Furthermore, the transmitting system includes the authentication key used for encoding the CW and the entitlement to receive data (or services) of the receiving system (i.e., a standardized serial number of the receiving system that is entitled to receive the corresponding broadcasting service or data) in the entitlement management message (EMM), which is then transmitted to the receiving system.

Accordingly, the authentication unit 3008 of the receiving system extracts the identification information of the receiving system and the identification information included in the EMM of the broadcasting service that is being received. Then, the authentication unit 3008 determines whether the identification information conform to each other, so as to perform the authentication process. More specifically, if the authentication unit 3008 determines that the information conform to each other, then the authentication unit 3008 eventually determines that the receiving system is entitled to receive the request broadcasting service.

In yet another example, the authentication unit 3008 of the receiving system may be detachably fixed to an external module. In this case, the receiving system is interfaced with the external module through a common interface (CI). In other words, the external module may receive the data scrambled by the receiving system through the common interface, thereby performing the descrambling process of the received data. Alternatively, the external module may also transmit only the information required for the descrambling process to the receiving system. The common interface is configured on a physical layer and at least one protocol layer. Herein, in consideration of any possible expansion of the protocol layer in a later process, the corresponding protocol layer may be configured to have at least one layer that can each provide an independent function.

The external module may either consist of a memory or card having information on the key used for the scrambling process and other authentication information but not including any descrambling function, or consist of a card having the above-mentioned key information and authentication information and including the descrambling function. Both the receiving system and the external module should be authenticated in order to provide the user with the paid broadcasting service provided (or transmitted) from the transmitting system. Therefore, the transmitting system can only provide the corresponding paid broadcasting service to the authenticated pair of receiving system and external module.

Additionally, an authentication process should also be performed between the receiving system and the external module through the common interface. More specifically, the module may communicate with the system manager 3015 included in the receiving system through the common interface, thereby authenticating the receiving system. Alternatively, the receiving system may authenticate the module through the common interface. Furthermore, during the authentication process, the module may extract the unique ID of the receiving system and its own unique ID and transmit the extracted IDs to the transmitting system. Thus, the transmitting system may use the transmitted ID values as information determining whether to start the requested service or as payment information. Whenever necessary, the system manager 3015 transmits the payment information to the remote transmitting system through the telecommunication module 3019.

The authentication unit 3008 authenticates the corresponding receiving system and/or the external module. Then, if the authentication process is successfully completed, the authentication unit 3008 certifies the corresponding receiving system and/or the external module as a legitimate system and/or module entitled to receive the requested paid broadcasting service. In addition, the authentication unit 3008 may also receive authentication-associated information from a mobile telecommunications service provider to which the user of the receiving system is subscribed, instead of the transmitting system providing the requested broadcasting service. In this case, the authentication-association information may either be scrambled by the transmitting system providing the broadcasting service and, then, transmitted to the user through the mobile telecommunications service provider, or be directly scrambled and transmitted by the mobile telecommunications service provider. Once the authentication process is successfully completed by the authentication unit 3008, the receiving system may descramble the scrambled broadcasting contents received from the transmitting system. At this point, the descrambling process is performed by the first and second descramblers 3004 and 3007. Herein, the first and second descramblers 3004 and 3007 may be included in an internal module or an external module of the receiving system.

The receiving system is also provided with a common interface for communicating with the external module including the first and second descramblers 3004 and 3007, so as to perform the descrambling process. More specifically, the first and second descramblers 3004 and 3007 may be included in the module or in the receiving system in the form of hardware, middleware or software. Herein, the descramblers 3004 and 3007 may be included in any one of or both of the module and the receiving system. If the first and second descramblers 3004 and 3007 are provided inside the receiving system, it is advantageous to have the transmitting system (i.e., at least any one of a service provider and a broadcast station) scramble the corresponding data using the same scrambling method.

Alternatively, if the first and second descramblers 3004 and 3007 are provided in the external module, it is advantageous to have each transmitting system scramble the corresponding data using different scrambling methods. In this case, the receiving system is not required to be provided with the descrambling algorithm corresponding to each transmitting system. Therefore, the structure and size of receiving system may be simplified and more compact. Accordingly, in this case, the external module itself may be able to provide CA functions, which are uniquely and only provided by each transmitting systems, and functions related to each service that is to be provided to the user. The common interface enables the various external modules and the system manager 3015, which is included in the receiving system, to communicate with one another by a single communication method. Furthermore, since the receiving system may be operated by being connected with at least one or more modules providing different services, the receiving system may be connected to a plurality of modules and controllers.

In order to maintain successful communication between the receiving system and the external module, the common interface protocol includes a function of periodically checking the status of the opposite correspondent. By using this function, the receiving system and the external module is capable of managing the status of each opposite correspondent. This function also reports the user or the transmitting system of any malfunction that may occur in any one of the receiving system and the external module and attempts the recovery of the malfunction.

In yet another example, the authentication process may be performed through software. More specifically, when a memory card having CAS software downloaded, for example, and stored therein in advanced is inserted in the receiving system, the receiving system receives and loads the CAS software from the memory card so as to perform the authentication process. In this example, the CAS software is read out from the memory card and stored in the first memory 3012 of the receiving system. Thereafter, the CAS software is operated in the receiving system as an application program.

According to an embodiment of the present invention, the CAS software is mounted on (or stored) in a middleware platform and, then executed. A Java middleware will be given as an example of the middleware included in the present invention. Herein, the CAS software should at least include information required for the authentication process and also information required for the descrambling process.

Therefore, the authentication unit 3008 performs authentication processes between the transmitting system and the receiving system and also between the receiving system and the memory card. At this point, as described above, the memory card should be entitled to receive the corresponding data and should include information on a normal receiving system that can be authenticated. For example, information on the receiving system may include a unique number, such as a standardized serial number of the corresponding receiving system. Accordingly, the authentication unit 3008 compares the standardized serial number included in the memory card with the unique information of the receiving system, thereby performing the authentication process between the receiving system and the memory card.

If the CAS software is first executed in the Java middleware base, then the authentication between the receiving system and the memory card is performed. For example, when the unique number of the receiving system stored in the memory card conforms to the unique number of the receiving system read from the system manager 3015, then the memory card is verified and determined to be a normal memory card that may be used in the receiving system. At this point, the CAS software may either be installed in the first memory 3012 upon the shipping of the present invention, or be downloaded to the first memory 3012 from the transmitting system or the module or memory card, as described above. Herein, the descrambling function may be operated by the data broadcasting application manger 3016 as an application program.

Thereafter, the CAS software parses the EMM/ECM packets outputted from the demultiplexer 3003, so as to verify whether the receiving system is entitled to receive the corresponding data, thereby obtaining the information required for descrambling (i.e., the CW) and providing the obtained CW to the descramblers 3004 and 3007. More specifically, the CAS software operating in the Java middleware platform first reads out the unique (or serial) number of the receiving system from the corresponding receiving system and compares it with the unique number of the receiving system transmitted through the EMM, thereby verifying whether the receiving system is entitled to receive the corresponding data. Once the receiving entitlement of the receiving system is verified, the corresponding broadcasting service information transmitted to the ECM and the entitlement of receiving the corresponding broadcasting service are used to verify whether the receiving system is entitled to receive the corresponding broadcasting service. Once the receiving system is verified to be entitled to receive the corresponding broadcasting service, the authentication key transmitted to the EMM is used to decode (or decipher) the encoded CW, which is transmitted to the ECM, thereby transmitting the decoded CW to the descramblers 3004 and 3007. Each of the descramblers 3004 and 3007 uses the CW to descramble the broadcasting service.

Meanwhile, the CAS software stored in the memory card may be expanded in accordance with the paid service which the broadcast station is to provide. Additionally, the CAS software may also include other additional information other than the information associated with the authentication and descrambling. Furthermore, the receiving system may download the CAS software from the transmitting system so as to upgrade (or update) the CAS software originally stored in the memory card. As described above, regardless of the type of broadcast receiving system, as long as an external memory interface is provided, the present invention may embody a CAS system that can meet the requirements of all types of memory card that may be detachably fixed to the receiving system. Thus, the present invention may realize maximum performance of the receiving system with minimum fabrication cost, wherein the receiving system may receive paid broadcasting contents such as broadcast programs, thereby acknowledging and regarding the variety of the receiving system. Moreover, since only the minimum application program interface is required to be embodied in the embodiment of the present invention, the fabrication cost may be minimized, thereby eliminating the manufacturer's dependence on CAS manufacturers. Accordingly, fabrication costs of CAS equipments and management systems may also be minimized.

Meanwhile, the descramblers 3004 and 3007 may be included in the module either in the form of hardware or in the form of software. In this case, the scrambled data that being received are descrambled by the module and then demodulated. Also, if the scrambled data that are being received are stored in the third memory 3018, the received data may be descrambled and then stored, or stored in the memory at the point of being received and then descrambled later on prior to being played (or reproduced). Thereafter, in case scramble/descramble algorithms are provided in the storage controller 3017, the storage controller 3017 scrambles the data that are being received once again and then stores the re-scrambled data to the third memory 3018.

In yet another example, the descrambled broadcasting contents (transmission of which being restricted) are transmitted through the broadcasting network. Also, information associated with the authentication and descrambling of data in order to disable the receiving restrictions of the corresponding data are transmitted and/or received through the telecommunications module 3019. Thus, the receiving system is able to perform reciprocal (or two-way) communication. The receiving system may either transmit data to the telecommunication module within the transmitting system or be provided with the data from the telecommunication module within the transmitting system. Herein, the data correspond to broadcasting data that are desired to be transmitted to or from the transmitting system, and also unique information (i.e., identification information) such as a serial number of the receiving system or MAC address.

The telecommunication module 3019 included in the receiving system provides a protocol required for performing reciprocal (or two-way) communication between the receiving system, which does not support the reciprocal communication function, and the telecommunication module included in the transmitting system. Furthermore, the receiving system configures a protocol data unit (PDU) using a tag-length-value (TLV) coding method including the data that are to be transmitted and the unique information (or ID information). Herein, the tag field includes indexing of the corresponding PDU. The length field includes the length of the value field. And, the value field includes the actual data that are to be transmitted and the unique number (e.g., identification number) of the receiving system.

The receiving system may configure a platform that is equipped with the Java platform and that is operated after downloading the Java application of the transmitting system to the receiving system through the network. In this case, a structure of downloading the PDU including the tag field arbitrarily defined by the transmitting system from a storage means included in the receiving system and then transmitting the downloaded PDU to the telecommunication module 3019 may also be configured. Also, the PDU may be configured in the Java application of the receiving system and then outputted to the telecommunication module 3019. The PDU may also be configured by transmitting the tag value, the actual data that are to be transmitted, the unique information of the corresponding receiving system from the Java application and by performing the TLV coding process in the receiving system. This structure is advantageous in that the firmware of the receiving system is not required to be changed even if the data (or application) desired by the transmitting system is added.

The telecommunication module within the transmitting system either transmits the PDU received from the receiving system through a wireless data network or configures the data received through the network into a PDU which is transmitted to the host. At this point, when configuring the PDU that is to be transmitted to the host, the telecommunication module within the transmitting end may include unique information (e.g., IP address) of the transmitting system which is located in a remote location. Additionally, in receiving and transmitting data through the wireless data network, the receiving system may be provided with a common interface, and also provided with a WAP, CDMA 1x EV-DO, which can be connected through a mobile telecommunication base station, such as CDMA and GSM, and also provided with a wireless LAN, mobile Internet, WiBro, WiMax, which can be connected through an access point. The above-described receiving system corresponds to the system that is not equipped with a telecommunication function. However, a receiving system equipped with telecommunication function does not require the telecommunication module 3019.

The broadcasting data being transmitted and received through the above-described wireless data network may include data required for performing the function of limiting data reception. Meanwhile, the demultiplexer 3003 receives either the real-time data outputted from the demodulating unit 3002 or the data read from the third memory 3018, thereby performing demultiplexing. In this embodiment of the present invention, the demultiplexer 3003 performs demultiplexing on the enhanced data packet. Similar process steps have already been described earlier in the description of the present invention. Therefore, a detailed of the process of demultiplexing the enhanced data will be omitted for simplicity.

The first descrambler 3004 receives the demultiplexed signals from the demultiplexer 3003 and then descrambles the received signals. At this point, the first descrambler 3004 may receive the authentication result received from the authentication unit 3008 and other data required for the descrambling process, so as to perform the descrambling process. The audio decoder 3005 and the video decoder 3006 receive the signals descrambled by the first descrambler 3004, which are then decoded and outputted. Alternatively, if the first descrambler 3004 did not perform the descrambling process, then the audio decoder 3005 and the video decoder 3006 directly decode and output the received signals. In this case, the decoded signals are received and then descrambled by the second descrambler 3007 and processed accordingly.

As described above, the DTV receiving system and method of processing broadcast signal in the DTV receiving system according to the present invention has the following advantages. More specifically, the DTV receiving system and method of processing broadcast signal in the DTV receiving system according to the present invention is highly protected against (or resistant to) any error that may occur when transmitting supplemental data through a channel. And, the present invention is also highly compatible to the conventional VBS receiving system. Moreover, the present invention may also receive the supplemental data without any error even in channels having severe ghost effect and noise.

Additionally, the transmitting system of the present invention configures the enhanced data packet to include at least any one of the enhanced data, which include information, and the known data, which are known by the transmitting system and the receiving system, and transmits the configured enhanced data packet. The receiving system used the known data for channel equalization, thereby enhancing the receiving performance. Particularly, when the plurality of enhanced data packets are transmitted in hierarchically differentiated areas, the CIR of each area is estimated in accordance with the characteristic of each area, so as to perform channel equalization, thereby enhancing the channel equalizing performance. Furthermore, the present invention is even more effective when applied to mobile and portable receivers, which are also liable to a frequent change in channel and which require protection (or resistance) against intense noise.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method of processing a digital broadcast signal for transmitting the digital broadcast signal, the method comprising:
   Forward Error Correction (FEC) and Cyclic Redundancy Check (CRC) encoding enhanced service data to build at least one Reed-Solomon (RS) frame of the enhanced service data;
   encoding the enhanced service data in the at least one built RS frame at a coding rate of at least 1/2 or 1/4 to output symbols;
   forming a data group including the encoded enhanced service data, a plurality of known data sequences and place holder bytes for main service data, MPEG headers and RS parity data;
   removing the place holder bytes for the main service data and the RS parity data which are included in the data group and replacing the place holder bytes for the MPEG headers with the MPEG headers, and outputting enhanced service data packets;
   multiplexing the output enhanced service data packets and main service data packets including main service data; and
   interleaving the enhanced service data and the main service data of the multiplexed enhanced and main service data packets in the data group,
   wherein the data group, having the interleaved enhanced service data and the interleaved main service data, includes first segments, second segments and third segments, the second segments being positioned between the first and third segments, the first segments having enhanced service data and main service data, the second segments having enhanced service data and the plurality of known data sequences, and the third segments having enhanced service data and main service data,
   wherein the enhanced service data in the first, second and third segments are encoded by non-systematic RS encoding, the main service data in the first and third segments are encoded by systematic RS encoding, and at least two of the plurality of known data sequences have different patterns.

2. The method of claim 1, further comprising:
randomizing the main service data in the multiplexed enhanced and main service data packets and bypassing the enhanced service data in the multiplexed enhanced and main service data packets.

3. The method of claim 1, wherein encoding the enhanced service data comprises:
converting data bytes of the enhanced service data included in the at least one built RS frame into data bits; and
encoding the converted data bits at a coding rate of at least 1/2 or 1/4 to output symbols.

4. The method of claim 3, wherein encoding the enhanced service data further comprises:
interleaving the output symbols; and
converting the interleaved symbols into data bytes of the enhanced service data.

5. An apparatus for processing a digital broadcast signal for transmitting the digital broadcast signal, the apparatus comprising:
a Reed-Solomon (RS) frame encoder configured to Forward Error Correction (FEC) and Cyclic Redundancy Check (CRC) encode enhanced service data to build at least one RS frame of the enhanced service data;
a block processor configured to encode the enhanced service data in the at least one built RS frame at a coding rate of at least 1/2 or 1/4 to output symbols;
a group formatter configured to form a data group including the encoded enhanced service data, a plurality of known data sequences and place holder bytes for main service data, MPEG headers, and RS parity data;
a packet formatter configured to remove the place holder bytes for the main service data and the RS parity data which are included in the data group and replace the place holder bytes for the MPEG headers with the MPEG headers, and output enhanced service data packets;
a packet multiplexer configured to multiplex the output enhanced service data packets and main service data packets including main service data; and
a data interleaver configured to interleave the enhanced service data and the main service data of the multiplexed enhanced and main service data packets in the data group,
wherein:
the data group, having the interleaved enhanced service data and the interleaved main service data, includes first segments, second segments, and third segments, the second segments being positioned between the first and third segments, the first segments having enhanced service data and main service data, the second segments having enhanced service data and the plurality of known data sequences and the third segments having enhanced service data and main service data, and
the enhanced service data in the first, second and third segments are encoded by non-systematic RS encoding, the main service data in the first and third segments are encoded by systematic RS encoding, and at least two of the plurality of known data sequences have different patterns.

6. The apparatus of claim 5, further comprising:
a modified data randomizer configured to randomize the main service data in the multiplexed enhanced and main service data packets and bypass the enhanced service data in the multiplexed enhanced and main service data packets.

7. The apparatus of claim 5, wherein the block processor is further configured to convert data bytes of the enhanced service data included in the at least one built RS frame into data bits and encode the converted data bits at a coding rate of at least 1/2 or 1/4 to output symbols.

8. The method of claim 7, wherein the block processor is further configured to interleave the output symbols and convert the interleaved symbols into data bytes of the enhanced service data.

* * * * *